(12) United States Patent
Nozawa et al.

(10) Patent No.: US 12,262,584 B2
(45) Date of Patent: *Mar. 25, 2025

(54) LIGHT-EMITTING DEVICE AND ELECTRONIC APPARATUS

(71) Applicant: SEIKO EPSON CORPORATION, Tokyo (JP)

(72) Inventors: Ryoichi Nozawa, Tatsuno-machi (JP); Atsushi Amano, Shiojiri (JP); Takeshi Koshihara, Matsumoto (JP); Akio Fukase, Chino (JP); Shinichi Iwata, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/530,988

(22) Filed: Dec. 6, 2023

(65) Prior Publication Data

US 2024/0114716 A1 Apr. 4, 2024

Related U.S. Application Data

(63) Continuation of application No. 17/851,607, filed on Jun. 28, 2022, now Pat. No. 11,882,724, which is a (Continued)

(30) Foreign Application Priority Data

Jul. 1, 2013 (JP) .................................. 2013-137784

(51) Int. Cl.
*H10K 50/852* (2023.01)
*H10K 50/81* (2023.01)
(Continued)

(52) U.S. Cl.
CPC ........... *H10K 50/852* (2023.02); *H10K 50/81* (2023.02); *H10K 50/844* (2023.02); (Continued)

(58) Field of Classification Search
CPC ............. H01L 27/3246; H01L 51/5265; H01L 27/3211; H01L 51/5206; H01L 51/5253; (Continued)

(56) References Cited

U.S. PATENT DOCUMENTS

| 2005/0112341 A1 | 5/2005 | Ito et al. |
| 2005/0116632 A1 | 6/2005 | Funamoto et al. |

(Continued)

FOREIGN PATENT DOCUMENTS

| JP | 2001-071558 A | 3/2001 |
| JP | 2005-174906 A | 6/2005 |

(Continued)

OTHER PUBLICATIONS

Jun. 3, 2016 Office Action issued in U.S. Appl. No. 14/314,640.
(Continued)

*Primary Examiner* — Khaja Ahmad
*Assistant Examiner* — Khatib A Rahman
(74) *Attorney, Agent, or Firm* — Oliff PLC

(57) ABSTRACT

A first light-emitting element and a second light-emitting element that have a resonance structure that causes output light from a light-emission functional layer to resonate between a reflective layer and a semi-transmissive reflective layer, and a pixel definition layer, and in which an aperture part is formed to correspond to each of the first light-emitting element and the second light-emitting element, are formed on a base. A first interval between the reflective layer and the semi-transmissive reflective layer in the first light-emitting element and a second interval between the reflective layer and the semi-transmissive reflective layer in the (Continued)

second light-emitting element are different, and a film thickness of the pixel definition layer is less than a difference between the first interval and the second interval.

8 Claims, 13 Drawing Sheets

Related U.S. Application Data continuation of application No. 17/173,530, filed on Feb. 11, 2021, now Pat. No. 11,404,673, which is a continuation of application No. 16/790,081, filed on Feb. 13, 2020, now Pat. No. 10,957,876, which is a continuation of application No. 16/031,421, filed on Jul. 10, 2018, now Pat. No. 10,608,208, which is a continuation of application No. 15/485,613, filed on Apr. 12, 2017, now Pat. No. 10,044,000, which is a continuation of application No. 14/314,640, filed on Jun. 25, 2014, now Pat. No. 9,647,238.

(51) Int. Cl.
  H10K 50/844   (2023.01)
  H10K 50/856   (2023.01)
  H10K 59/122   (2023.01)
  H10K 59/35    (2023.01)
  H10K 102/00   (2023.01)

(52) U.S. Cl.
  CPC ......... *H10K 50/856* (2023.02); *H10K 59/122* (2023.02); *H10K 59/35* (2023.02); *H10K 2102/00* (2023.02)

(58) Field of Classification Search
  CPC ........... H01L 51/5271; H01L 2251/301; H01L 2251/303; H10K 50/852; H10K 50/81; H10K 50/844; H10K 50/856; H10K 59/122; H10K 59/35; H10K 2102/00; H10K 59/873; H10K 59/876
  See application file for complete search history.

(56) References Cited

U.S. PATENT DOCUMENTS

| | | | |
|---|---|---|---|
| 2005/0200273 A1* | 9/2005 | Nozawa | H01L 51/5221 313/503 |
| 2006/0055313 A1 | 3/2006 | Bae et al. | |
| 2006/0108919 A1 | 5/2006 | Kobayashi | |
| 2007/0182323 A1* | 8/2007 | Ogata | H01L 24/97 313/512 |
| 2007/0216289 A1 | 9/2007 | Kuma et al. | |
| 2007/0231503 A1 | 10/2007 | Hwang et al. | |
| 2007/0273279 A1* | 11/2007 | Kobayashi | H01L 51/5265 313/507 |
| 2008/0122372 A1 | 5/2008 | Yoo et al. | |
| 2009/0072693 A1 | 3/2009 | Cok et al. | |
| 2009/0085478 A1 | 4/2009 | Cok et al. | |
| 2009/0091238 A1 | 4/2009 | Cok et al. | |
| 2009/0218569 A1 | 9/2009 | Fujikawa | |
| 2010/0012961 A1 | 1/2010 | Tobise | |
| 2010/0052524 A1 | 3/2010 | Kinoshita | |
| 2010/0053038 A1 | 3/2010 | Sakamoto | |
| 2011/0114929 A1 | 5/2011 | Fujita et al. | |
| 2011/0120755 A1 | 5/2011 | Lee et al. | |
| 2011/0272715 A1 | 11/2011 | Kang et al. | |
| 2011/0310069 A1 | 12/2011 | Sagawa | |
| 2011/0316007 A1 | 12/2011 | Sagawa | |
| 2011/0317429 A1 | 12/2011 | Aiba et al. | |
| 2012/0038267 A1 | 2/2012 | Hanamura et al. | |
| 2012/0097952 A1 | 4/2012 | Kang et al. | |
| 2012/0229014 A1* | 9/2012 | Shiratori | H01L 51/5265 313/498 |
| 2012/0319115 A1* | 12/2012 | Lee | H01L 27/1259 257/59 |
| 2013/0307006 A1 | 11/2013 | Koshihara et al. | |
| 2014/0110701 A1 | 4/2014 | Noh | |
| 2014/0117334 A1* | 5/2014 | Nakamura | H01L 51/5203 257/40 |
| 2014/0306209 A1* | 10/2014 | Osaki | H05B 33/10 257/40 |
| 2014/0319475 A1* | 10/2014 | Joo | H01L 27/3246 257/40 |
| 2014/0339521 A1* | 11/2014 | Ozawa | H01L 51/5253 257/40 |
| 2014/0353635 A1 | 12/2014 | Chou et al. | |
| 2015/0137081 A1* | 5/2015 | Kim | H01L 27/3211 257/40 |
| 2015/0138171 A1* | 5/2015 | Kim | G09G 3/3266 345/205 |
| 2017/0352842 A1 | 12/2017 | Shiratori et al. | |

FOREIGN PATENT DOCUMENTS

| | | |
|---|---|---|
| JP | 2005-174907 A | 6/2005 |
| JP | 2005-285743 A | 10/2005 |
| JP | 2005-326799 A | 11/2005 |
| JP | 2006-278257 A | 10/2006 |
| JP | 2007-147814 A | 6/2007 |
| JP | 2009-134067 A | 6/2009 |
| JP | 2009-176589 A | 8/2009 |
| JP | 2010-056015 A | 3/2010 |
| JP | 2010-056016 A | 3/2010 |
| JP | 2010-056017 A | 3/2010 |
| JP | 2010-067517 A | 3/2010 |
| JP | 4525536 B2 | 8/2010 |
| JP | 2010-211984 A | 9/2010 |
| JP | 2010-232163 A | 10/2010 |
| JP | 2010-539653 A | 12/2010 |
| JP | 2010-541160 A | 12/2010 |
| JP | 2010-541180 A | 12/2010 |
| JP | 2011-23744 A | 2/2011 |
| JP | 2011-29195 A | 2/2011 |
| JP | 2011-139995 A | 7/2011 |
| JP | 2011-141990 A | 7/2011 |
| JP | 2011-154797 A | 8/2011 |
| JP | 2012-186083 A | 9/2012 |
| JP | 2012-248517 A | 12/2012 |
| JP | 2013-73884 A | 4/2013 |
| JP | 2013-109996 A | 6/2013 |

OTHER PUBLICATIONS

Aug. 29, 2016 Office Action issued in U.S. Appl. No. 14/314,640.
Dec. 15, 2014 Office Action issued in U.S. Appl. No. 14/314,640.
Nov. 23, 2015 Office Action issued in U.S. Appl. No. 14/314,640.
Jul. 17, 2015 Office Action issued in U.S. Appl. No. 14/314,640.
Nov. 17, 2017 Office Action issued in U.S. Appl. No. 15/485,613.
Feb. 7, 2019 Office Action issued in U.S. Appl. No. 16/031,421.
Aug. 8, 2019 Office Action issued in U.S. Appl. No. 16/031,421.

* cited by examiner

LIGHT-EMITTING DEVICE AND ELECTRONIC APPARATUS

This application is a continuation application of U.S. Ser. No. 17/851,607, filed Jun. 28, 2022, which is a continuation of Ser. No. 17/173,530, filed Feb. 11, 2021 (now U.S. Pat. No. 11,404,673), which is a continuation of U.S. patent application Ser. No. 16/790,081, filed Feb. 13, 2020 (now U.S. Pat. No. 10,957,876), which is a continuation of U.S. patent application Ser. No. 16/031,421 filed Jul. 10, 2018 (now U.S. Pat. No. 10,608,208, which is a continuation application of U.S. patent application Ser. No. 15/485,613 filed Apr. 12, 2017 (now U.S. Pat. No. 10,044,000), which is a continuation application of U.S. patent application Ser. No. 14/314,640 filed on Jun. 25, 2014 (now U.S. Pat. No. 9,647,238), which claims the benefit of Japanese Patent Application No. 2013-137784 filed Jul. 1, 2013. The disclosure of the prior applications is hereby incorporated by reference herein in their entirety.

BACKGROUND

1. Technical Field

The present invention relates to a light-emitting device that uses a light-emitting material such as an organic EL material, for example.

2. Related Art

Light-emitting devices in which, for example, light-emitting elements that use an organic EL material are arranged on a substrate in a planar manner, have been suggested as display devices of various electronic apparatuses in the related art. JP-A-2010-56017 discloses light-emitting device in which light-emitting elements are formed in regions in which banks are formed at the periphery thereof. More specifically, banks are formed at the periphery of a first electrode (a positive electrode) that is formed on the surface of a substrate individually for each pixel, a light-emitting layer is formed in a region that is surrounded by the banks, and a second electrode (a negative electrode) that coats the light-emitting layer and the banks is formed across the entire area of the substrate. A resonance structure that causes output light from the light-emitting layer to resonate between a reflective layer and a semi-transmissive reflective layer (the second electrode) is formed in each light-emitting element. The resonance wavelength of the resonance structure is set individually for each display color of each pixel depending on the film thickness of an optical path length adjustment layer that is formed between the reflective layer and the semi-transmissive reflective layer.

In the technique of JP-A-2010-56017, since the film thickness of the optical path length adjustment layer between the reflective layer and the semi-transmissive reflective layer differs for each pixel to correspond to the differing display colors, a difference in levels is caused as a result of the difference in the film thickness of the optical path length adjustment layer in each layer that is formed in layers that are above the optical path length adjustment layer. In addition, in the technique of JP-A-2010-56017, a difference in levels that corresponds to the film thickness of the banks is caused between a region in which the banks are formed on the substrate and a region (for example, a light-emitting region) in which the banks are removed to correspond to each light-emitting element. The differences in levels in each layer can lead to defective film formation such as the breakage of conductive layers and short-circuiting of conductive layers, for example.

SUMMARY

An advantage of some aspects of the invention is that differences in the levels of each layer in the light-emitting device are reduced.

According to an aspect of the present invention, there is provided a light-emitting device in which a first light-emitting element and a second light-emitting element that have a resonance structure that causes output light from a light-emission functional layer to resonate between a reflective layer and a semi-transmissive reflective layer between which the light-emission functional layer is interposed, and a pixel definition layer that is formed of an insulating material, and in which an aperture part is formed to correspond to each of the first light-emitting element and the second light-emitting element, are formed on a base, in which a first interval between the reflective layer and the semi-transmissive reflective layer in the first light-emitting element and a second interval between the reflective layer and the semi-transmissive reflective layer in the second light-emitting element are different, and a film thickness of the pixel definition layer is less than a difference between the first interval and the second interval. According to the abovementioned configuration, since the film thickness of the pixel definition layer is less than a difference between the first interval and the second interval, it is possible to reduce the differences in the levels of each layer that are caused by film thickness of the pixel definition layer.

Additionally, in a configuration in which a resonance structure that causes output light from a light-emission functional layer to resonate between a reflective layer and a semi-transmissive reflective layer, is formed in the light-emitting elements, and a pixel definition layer that has aperture parts that correspond to the light-emitting elements is formed between the reflective layer and the semi-transmissive reflective layer, the intervals between the reflective layer and the semi-transmissive reflective layer in a region that is in the vicinity of an inner peripheral surface of the aperture parts of the pixel definition layer differ from target intervals (resonance lengths that correspond to display colors) due to the influence of the film thickness of the pixel definition layer, and there is a possibility that a different display color from a desired display color will be perceived as a result. In the abovementioned preferable aspect, the film thickness of the pixel definition layer is less than a difference between the first interval and the second interval. Therefore, in comparison with a configuration in which the film thickness of the pixel definition layer is greater than a difference between the first interval and the second interval, there is an advantage in that the influence of the pixel definition layer that is applied to the intervals between the reflective layer and the semi-transmissive reflective layer in a region that is in the vicinity of an inner peripheral surface of the aperture parts of the pixel definition layer, can be reduced.

According to a preferable aspect of the present invention, there is provided a light-emitting device that further includes a sealing layer that coats the first light-emitting element and the second light-emitting element, in which a film thickness of the sealing layer is greater than a difference between the first interval and the second interval. In the abovementioned aspect, since the sealing layer is formed using a film thickness that is greater than the difference between the first interval and the second interval, there is an advantage in that it is possible to effectively reduce differences in levels that are caused by differences the resonance length of each light-emitting element in the surface of the sealing layer. In a configuration in which the first light-emitting element and the second light-emitting element respectively include a first electrode, a second electrode that is positioned on an opposite side of the substrate when viewed from the first electrode, and functions as a semi-transmissive reflective layer, and a light-emission functional layer that is positioned between the first electrode and the second electrode, the sealing layer is an insulating layer (for example, a first sealing layer 71) that is in direct contact with a surface of the second electrode.

The light-emitting devices according to the abovementioned aspects can be used in various electronic apparatuses as display apparatuses, for example. More specifically, head-mounted display apparatuses and electronic viewfinders of imaging apparatuses can be included as preferable examples of electronic apparatuses of the present invention, but the scope of application of the present invention is not limited to the abovementioned examples.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
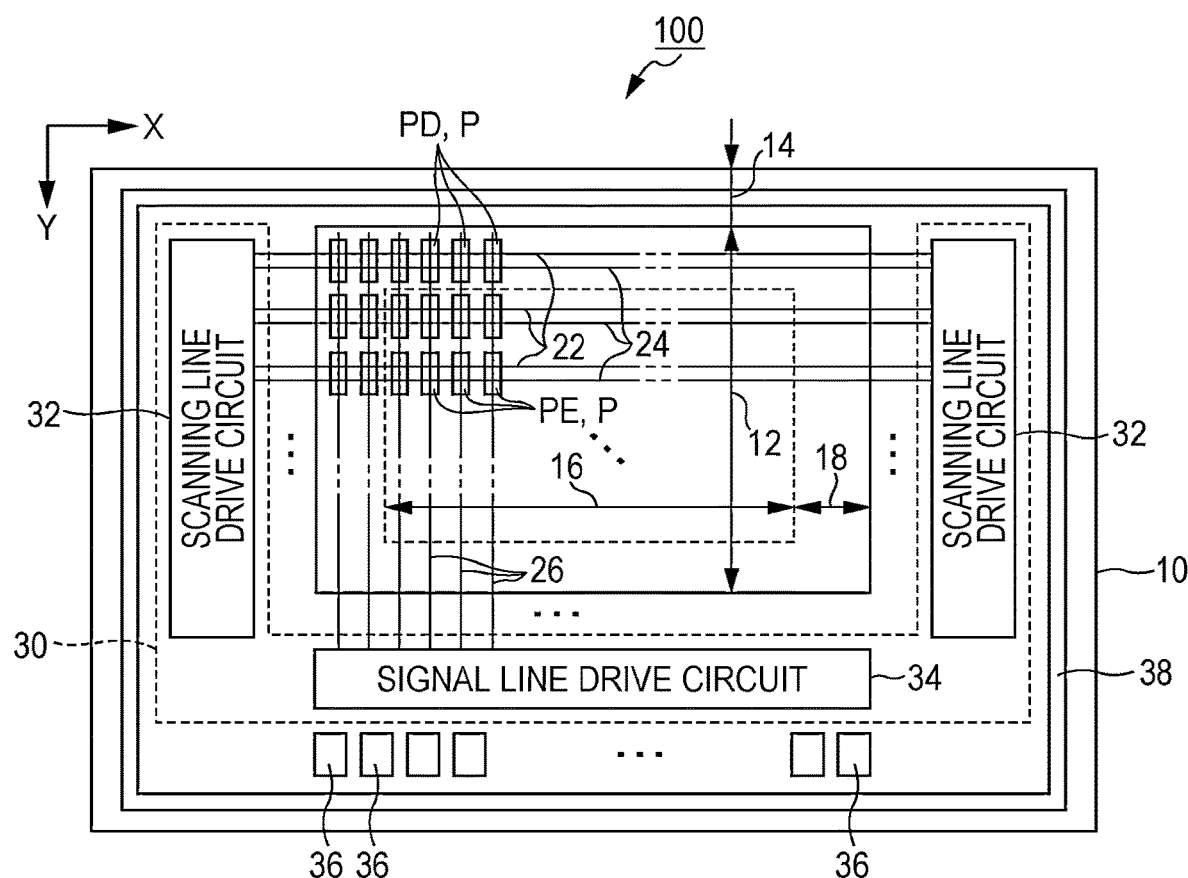
FIG. 1 is a plan view of a light-emitting device of a first embodiment of the present invention.

FIG. 1 is a plan view of a light-emitting device 100 according to a first embodiment of the present invention. The light-emitting device 100 of the first embodiment is an organic EL apparatus in which light-emitting elements that use an organic EL material are formed on the surface of a substrate 10. The substrate 10 is a plate-shaped member that is formed from a semiconductor material such as silicon (a semiconductor substrate), and is used as a base (a foundation) on which a plurality of light-emitting elements are formed. As shown in FIG. 1, a surface of the substrate 10 is divided into a first region 12 and a second region 14. The first region 12 is a rectangular region, and the second region 14 is a region with a rectangular frame shape that surrounds the first region 12.

A plurality of scanning lines 22 that extend in an X direction, a plurality of control lines 24 that extend in the X direction to correspond to each scanning line 22, and a plurality of signal lines 26 that extend in a Y direction that intersects the X direction are formed in the first region 12. A pixel P (PD, PE) is formed to correspond to each intersection of the plurality of scanning lines 22 and the plurality of signal lines 26. Therefore, a plurality of pixels P are arranged in matrix form across the X direction and the Y direction.

A drive circuit 30, a plurality of mounting terminals 36, and guard ring 38 are installed in the second region 14. The drive circuit 30 is a circuit that drives each pixel P, and is configured to include two scanning line drive circuits 32 that are installed in positions that interpose the first region 12 therebetween in the X direction, and a signal line drive circuit 34 that is installed in a region of the second region 14 that extends in the X direction. The plurality of mounting terminals 36 are formed inside a region that is on a side that is opposite the first region 12 with the signal line drive circuit 34 interposed therebetween, and are electrically connected to an external circuit (for example, an electronic circuit that is mounted on a wiring substrate) such as a control circuit or a power source circuit through a flexible wiring substrate (not shown in the drawings) that is joined to the substrate 10.

A plurality of the light-emitting devices 100 of the first embodiment are formed in a batch by cutting (scribing) a source substrate that is a size that corresponds to a plurality of substrates 10. The guard ring 38 in FIG. 1 prevents the spread of the influence of the impacts and static electricity from during the cutting of the source substrate to the drive circuit 30 and each pixel P, and the intrusion of moisture from an end surface (a cut surface of the source substrate) of each substrate 10. As shown in FIG. 1, the guard ring 38 is formed in a ring shape (a rectangular frame shape) that surrounds the drive circuit 30, the plurality of mounting terminals 36 and the first region 12.

The first region 12 in FIG. 1 is divided into a display region 16 and a peripheral region 18. The display region 16 is a region in which an image is effectively displayed through the driving of each pixel P. The peripheral region 18 is a rectangular frame shape that surrounds the display region 16, and pixels P (hereinafter referred to as "dummy pixels PD") that have structures that are similar to those of each pixel P inside the display region 16 but do not contribute to the display of an image in a practical sense, are disposed therein. In order to clarify the distinction between the dummy pixels P inside the peripheral region 18 and the pixels inside the display region 16, there are cases in which the pixels P inside the display region 16 are referred to as "display pixels PE". The display pixels PE are the component that forms the minimum unit of light emission.

Figure 2:
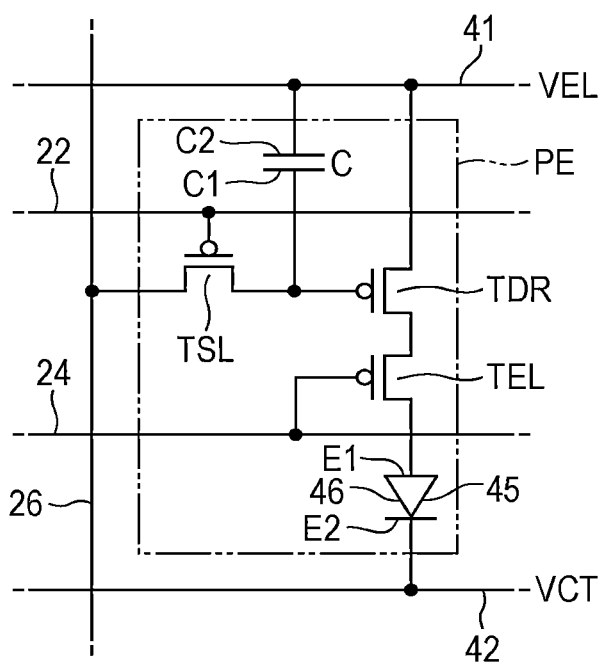
FIG. 2 is a circuit diagram of a pixel.

FIG. 2 is a circuit diagram of each display pixel PE that is positioned inside the display region 16. As shown in FIG. 2, the display pixel PE is configured to include a light-emitting element 45, a drive transistor TDR, a light-emission control transistor TEL, a selection transistor TSL and a capacitance element C. Additionally, in the first embodiment, each transistor T (TDR, TEL and TSL) of the display pixel PE is configured as a P-channel transistor, but it is also possible to use an N-channel transistor.

The light-emitting element 45 is an electrical light-emitting element in which a light-emission functional layer 46 that includes a light-emitting layer that is made from an organic EL material is provided between a first electrode (a positive electrode) E1 and a second electrode (a negative electrode) E2. The first electrode E1 is formed separately for each display pixel PE and the second electrode E2 is continuous across a plurality of pixels P. As can be understood from FIG. 2, the light-emitting element 45 is disposed on a pathway that links a first power source conductor 41 and a second power source conductor 42. The first power source conductor 41 is power source wiring to which a higher-side power source potential VEL is supplied, and the second power source conductor 42 is power source wiring to which a lower-side power source potential (for example, a ground potential) VCT is supplied.

The drive transistor TDR and the light-emission control transistor TEL are disposed in series with respect to the light-emitting element 45 on a pathway that links the first power source conductor 41 and the second power source conductor 42. More specifically, a first end (a source) of a pair of current terminals of the drive transistor TDR is connected to the first power source conductor 41. The light-emission control transistor TEL functions as a switch that controls the conductive state (conductive and non-conductive) of a second end (a drain) of the pair of current terminals of the drive transistor TDR and the first electrode E1 of the light-emitting element 45. The drive transistor TDR creates a drive current with a current value that corresponds to a voltage between a gate and the source thereof. In a state in which the light-emission control transistor TEL is controlled to be in an ON state, the drive current is supplied from the drive transistor TDR to the light-emitting element 45 via the light-emission control transistor TEL, and the light-emitting element 45 emits light at a brightness that corresponds to the current value of the drive current. In contrast to this, in a state in which the light-emission control transistor TEL is controlled to be in an OFF state, the supply of the drive current to the light-emitting element 45 is blocked, and the light-emitting element 45 is turned off. A gate of the light-emission control transistor TEL is connected to a control line 24.

The selection transistor TSL in FIG. 2 functions as a switch that controls the conductive state (conductive and non-conductive) of a signal line 26 and the gate of the drive transistor TDR. A gate of the selection transistor TSL is connected to a scanning line 22. In addition, the capacitance element C is an electrostatic capacity in which a dielectric body is provided between a first electrode C1 and a second electrode C2. The first electrode C1 is connected to the gate of the drive transistor TDR, and the second electrode C2 is connected to the first power source conductor 41 (the source of the drive transistor TDR). Therefore, the capacitance element C maintains the voltage between the gate and the source of the drive transistor TDR.

The signal line drive circuit 34 supplies a gradation potential (a data signal), which corresponds to a gradation that an image signal that is supplied from an external circuit designates to each display pixel PE, in parallel to a plurality of signal lines 26 in each write-in period (horizontal scanning period). On the other hand, the scanning line drive circuit 32 sequentially selects each of a plurality of scanning lines 22 in each write-in period by supplying a scanning signal to each scanning line 22. A selection transistor TSL of a display pixel PE that corresponds to a scanning line 22 that the scanning line drive circuit 32 has selected transitions to an ON state. Therefore, a gradation potential is supplied to the gate of the drive transistor TDR of each display pixel PE via the signal line 26 and the selection transistor TSL, and a voltage that corresponds to the gradation potential is maintained in the capacitance element C. On the other hand, once the selection of the scanning line 22 in the write-in period finishes, the scanning line drive circuit 32 controls the light-emission control transistor TEL of each display pixel PE that corresponds to a certain control line 24 to an ON state by supplying a control signal to each control line 24. Therefore, a drive current that corresponds to the voltage that is maintained in the capacitance element C in an immediately preceding write-in period is supplied from the drive transistor TDR to the light-emitting element 45 via the light-emission control transistor TEL. An arbitrary image that an image signal designates is displayed in the display region 16 as a result of each light-emitting element 45 emitting light at a brightness that corresponds to the gradation potential in the abovementioned manner.

Figure 3:
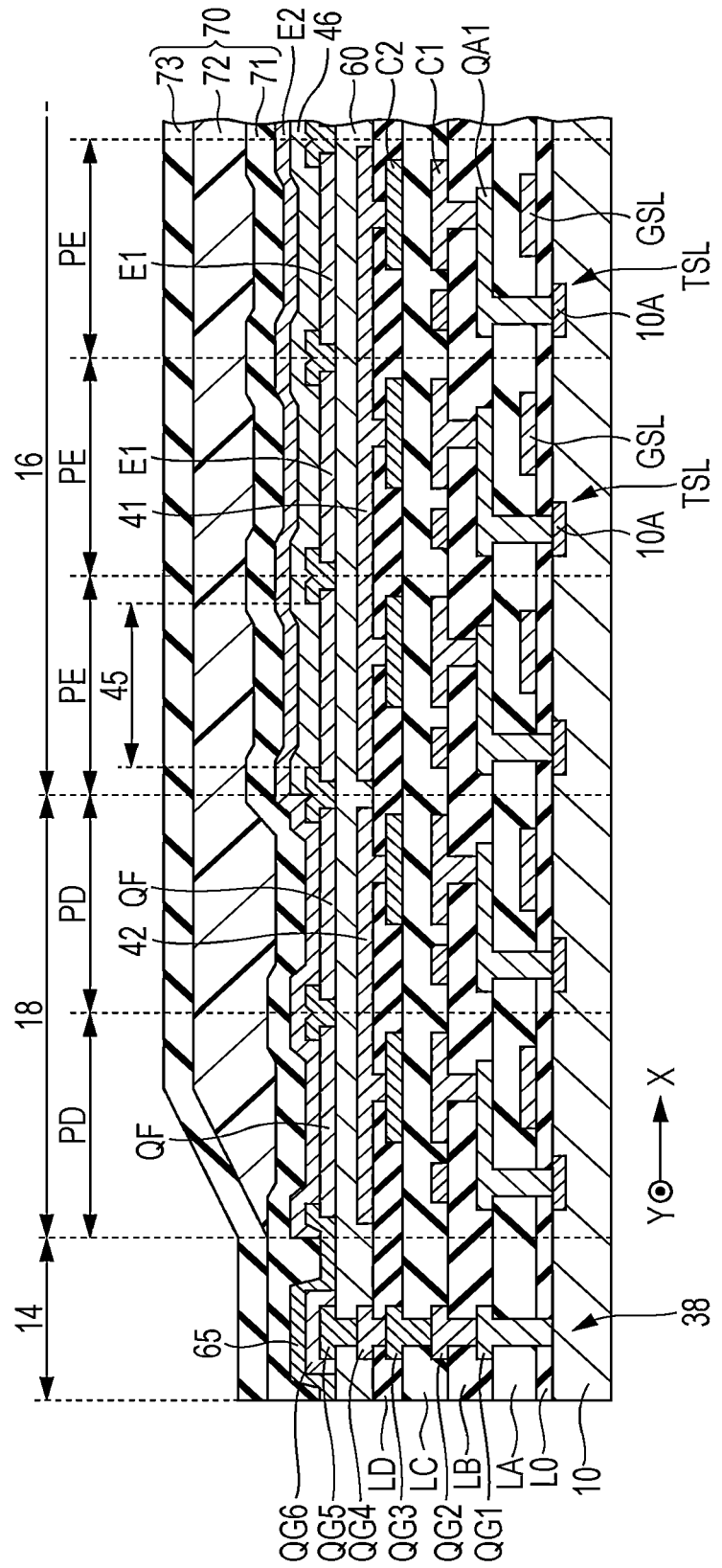
FIG. 3 is a cross-sectional view of the light-emitting apparatus.
Figure 4:
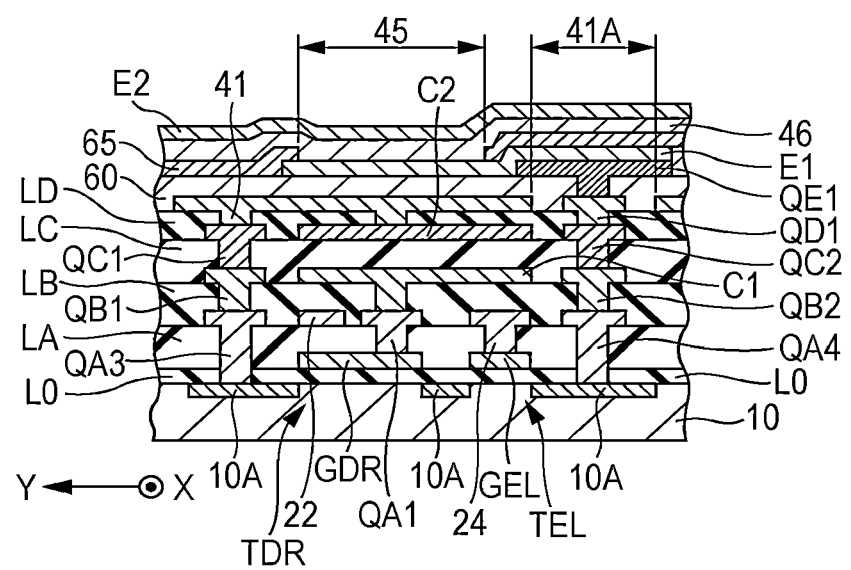
FIG. 4 is a cross-sectional view of the light-emitting apparatus.

Hereinafter, a specific structure of a light-emitting device 100 of the first embodiment will be described. Additionally, for the convenience of description, there are cases in which the dimensions and scale size of each component in the drawings that are referred to in the following description differ from the light-emitting device 100 in a practical sense. FIGS. 3 and 4 are cross-sectional views of the light-emitting device 100, and FIGS. 5 to 9 are plan views in which states of the surface of the substrate 10 are shown at stages of forming the various components of the light-emitting device 100 focusing on an individual display pixel PE. A cross-sectional view that corresponds to a cross-section that includes a line III-III in FIGS. 5 to 9 corresponds to FIG. 3, a cross-sectional view that corresponds to a cross-section of a line IV-IV in FIGS. 5 to 9 corresponds to FIG. 4. Additionally, FIGS. 5 to 9 are plan views, but from a viewpoint of simplifying the visual understanding of each component, the same type of shading as that in FIG. 3 or 4 has been applied to components that are common to either FIG. 3 or 4 for descriptive purposes.

Figure 5:
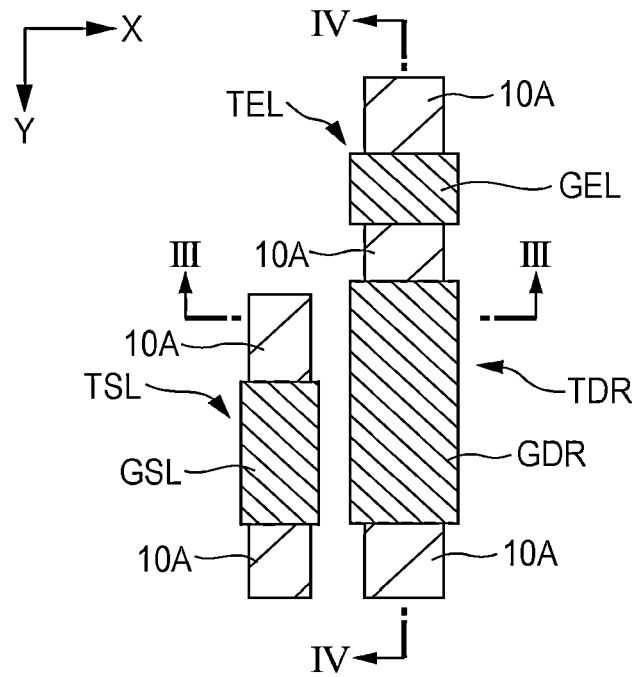
FIG. 5 is an explanatory drawing of each component that is formed on a substrate.

As can be understood from FIGS. 3 to 5, an active region 10A (source and drain region) of each transistor T (TDR, TEL and TSL) of the display pixel PE is formed on the surface of the substrate 10 that is formed by a semiconductor material such as silicon. Ions are implanted into the active region 10A. There is an active layer of each transistor T (TDR, TEL and TSL) of the display pixel PE between a source region and a drain region, and a different type of ions from those of the active region 10A are implanted in the active layer, but this is not shown in the drawings for the convenience of description. As shown in FIGS. 3 and 4, a surface of the substrate 10 on which the active region 10A is formed is coated with an insulating film L0 (a gate insulating film), and each gate of the transistors T (GDR, GEL and GSL) is formed on the surface of the insulating film L0. The gate of each transistor T opposes the active layer with the insulating film L0 interposed therebetween. The gate GSL of the selection transistor TSL, the gate GDR of the drive transistor TDR and the gate GEL of the light-emission control transistor TEL are shown in FIG. 4.

As can be understood from FIGS. 3 and 4, a multi-layered wiring layer in which a plurality of insulating layers L (LA to LD) and a plurality of conductive layers (wiring layers) are alternately laminated, is formed on the surface of the insulating film L0 on which the gate G of each transistor T is formed. Each insulating layer L is formed by an insulating inorganic material such as a silicon compound (typically silicon nitride or silicon oxide), for example. Additionally, in the following description, a relationship in which a plurality of components are formed in a batch during the same process due to the selective removal of conductive layers (a single layer or multiple layers), is referred to as "being formed from the same layer".

Figure 6:
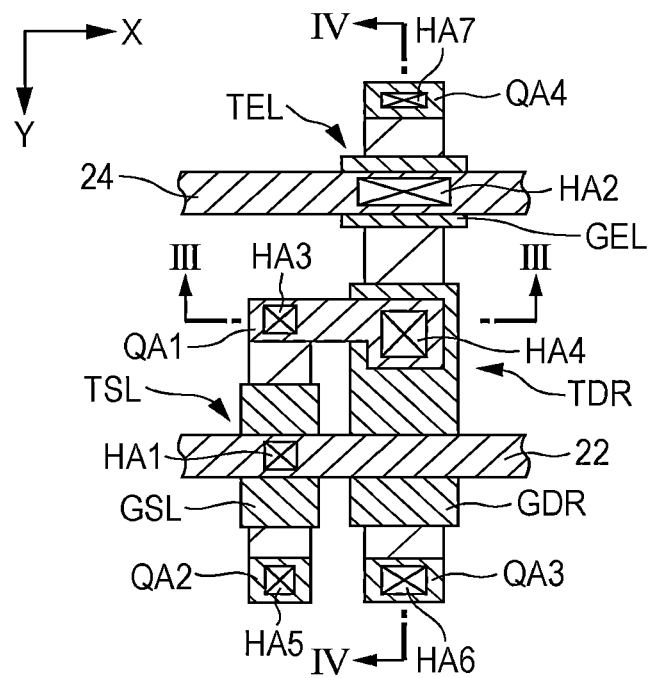
FIG. 6 is an explanatory drawing of each component that is formed on a substrate.

The insulating layer LA is formed on the surface of the insulating film L0 on which the gate G of each transistor T is formed. As can be understood from FIGS. 3, 4 and 6, a scanning line 22, a control line 24 and a plurality of relay electrodes QA (QA1, QA2, QA3 and QA4) are formed from the same layer on the surface of the insulating layer LA. The scanning line 22 and the control line 24 extend linearly in the X direction across a plurality of pixels P with an interval therebetween. More specifically, as shown in FIG. 6, the scanning line 22 is formed so as to pass through an upper section of the gate GSL of the selection transistor TSL and an upper section of the gate GDR of the drive transistor TDR, and is electrically connected to the gate GSL of the selection transistor TSL through a conduction hole (contact hole) HA1 that penetrates the insulating layer LA. The conduction hole HA1 is formed so as to overlap with the gate GSL of the selection transistor TSL and the active layer in a plan view. On the other hand, control line 24 is formed so as to pass through an upper section of the gate GEL of the light-emission control transistor TEL, and is electrically connected to the gate GEL of the light-emission control transistor TEL through a conduction hole HA2 that penetrates the insulating layer LA. The conduction hole HA2 is formed so as to overlap with the gate GEL of the light-emission control transistor TEL and the active layer in a plan view.

The relay electrode QA1 is wiring that connects the active region 10A of the selection transistor TSL and the gate GDR of the drive transistor TDR, and as shown in FIG. 6, is positioned between the scanning line 22 and the control line 24 in a plan view. More specifically, as can be understood from FIGS. 4 and 6, the relay electrode QA1 is electrically connected to the active region 10A of the selection transistor TSL through a conduction hole HA3 that penetrates the insulating layer LA and the insulating film L0, in addition to being electrically connected to the gate GDR of the drive transistor TDR through a conduction hole HA4 of the insulating layer LA. In addition, as can be understood from FIG. 6, a relay electrode QA2 is electrically connected to the active region 10A of the selection transistor TSL through a conduction hole HA5 that penetrates the insulating layer LA and the insulating film L0. A relay electrode QA3 is electrically connected to the active region 10A (source) of the drive transistor TDR through a conduction hole HA6 that penetrates the insulating layer LA and the insulating film L0. A relay electrode QA4 is electrically connected to the active region 10A (drain) of the light-emission control transistor TEL through a conduction hole HA7 that penetrates the insulating layer LA and the insulating film L0. As can be understood from FIG. 6, each of the selection transistor TSL, the drive transistor TDR and the light-emission control transistor TEL are formed so that the channel length thereof runs along the Y direction. In addition, the drive transistor TDR and the light-emission control transistor TEL are arranged along the Y direction, and the selection transistor TSL is disposed in a position that is shifted in the X direction (a negative side of the X direction in FIG. 6) with respect to the drive transistor TDR and the light-emission control transistor TEL.

Figure 7:
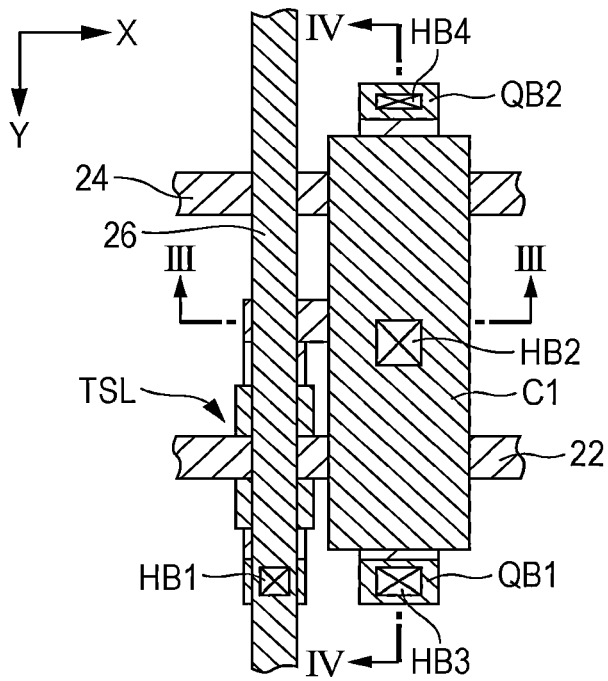
FIG. 7 is an explanatory drawing of each component that is formed on a substrate.

The insulating layer LB is formed on the surface of the insulating layer LA on which the scanning line 22, the control line 24 and the plurality of relay electrodes QA are formed. As can be understood from FIGS. 3, 4 and 7, a signal line 26, a first electrode C1 and a plurality of relay electrodes QB (QB1 and QB2) are formed from the same layer on the surface of the insulating layer LB. The signal line 26 extends linearly in the Y direction across a plurality of pixels P. The signal line 26 is electrically insulated from the scanning line 22 and the control line 24 by the insulating layer LA. More specifically, the signal line 26 is formed so as to pass through an upper section of the active region 10A (the source and the drain) and the active layer of the selection transistor TSL and an upper section of the relay electrode QA1 that is electrically connected to the gate GDR of the drive transistor TDR, and extends along a direction (the Y direction) of the channel length of the selection transistor TSL in addition to overlapping with the selection transistor TSL in a plan view. In addition, the signal line 26 is formed in a layer that is above the active regions 10A (the source and the drain) of each transistor T (TDR, TEL and TSL) and the gate G of each transistor T. As can be understood from FIG. 7, the signal line 26 is electrically connected to the relay electrode QA2 through a conduction hole HB1 that penetrates the insulating layer LB. That is, the signal line 26 and the active region 10A of the selection transistor TSL (source) are connected through the relay electrode QA2. The first electrode C1 in FIG. 7 is electrically connected to the relay electrode QA1 through a conduction hole HB2 that penetrates the insulating layer LB. That is, the first electrode C1 of the capacitance element C and the gate GDR of the drive transistor TDR are connected through the relay electrode QA1. A relay electrode QB1 in FIG. 7 is electrically connected to the relay electrode QA3 through a conduction hole HB3 of the insulating layer LB, and relay electrode QB2 is electrically connected to the relay electrode QA4 through a conduction hole HB4 of the insulating layer LB.

Figure 8:
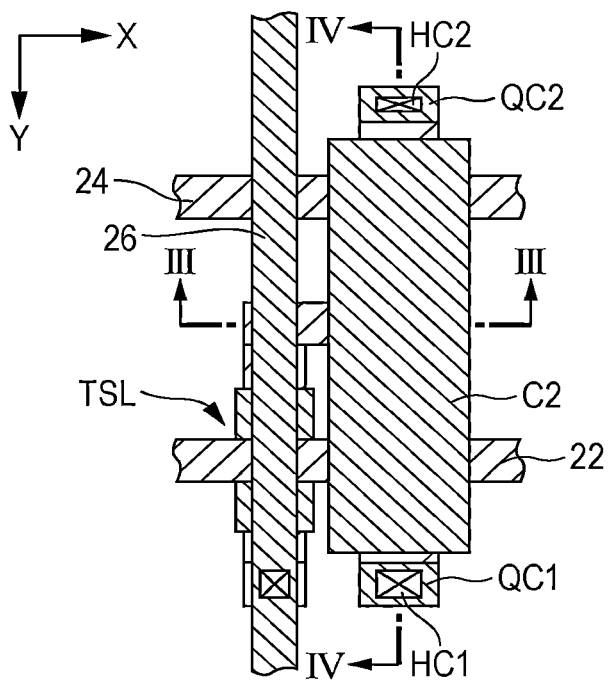
FIG. 8 is an explanatory drawing of each component that is formed on a substrate.

The insulating layer LC is formed on the surface of the insulating layer LB on which signal line 26, the first electrode C1 and the plurality of relay electrodes QB (QB1 and QB2) are formed. As can be understood from FIGS. 3, 4 and 8, a second electrode C2 and a plurality of relay electrodes QC (QC1 and QC2) are formed from the same layer on the surface of the insulating layer LC. The second electrode C2 is formed in a shape and position that overlap with the first electrode C1 in a plan view (that is, a state of being viewed from a direction that is perpendicular to the surface of the substrate 10). As can be understood from FIG. 3, the capacitance element C is configured by the first electrode C1, the second electrode C2 and the insulating layer LC that is therebetween. As shown in FIG. 8, the capacitance element C (the first electrode C1 and the second electrode C2) is installed so as to overlap with the drive transistor TDR and the light-emission control transistor TEL in a plan view. A relay electrode QC1 in FIG. 8 is electrically connected to the relay electrode QB1 through a conduction hole HC1 of the insulating layer LC, and relay electrode QC2 is electrically connected to the relay electrode QB2 through a conduction hole HC2 of the insulating layer LC.

As shown in FIGS. 3 and 4, the insulating layer LD is formed on the surface of the insulating layer LC on which the second electrode C2 and the plurality of relay electrodes QC (QC1 and QC2) are formed. The abovementioned description focused on the display pixels PE, but the structure of each component from the surface of the substrate 10 to the insulating layer LD is common to the dummy pixels PD inside the peripheral region 18.

Figure 10:
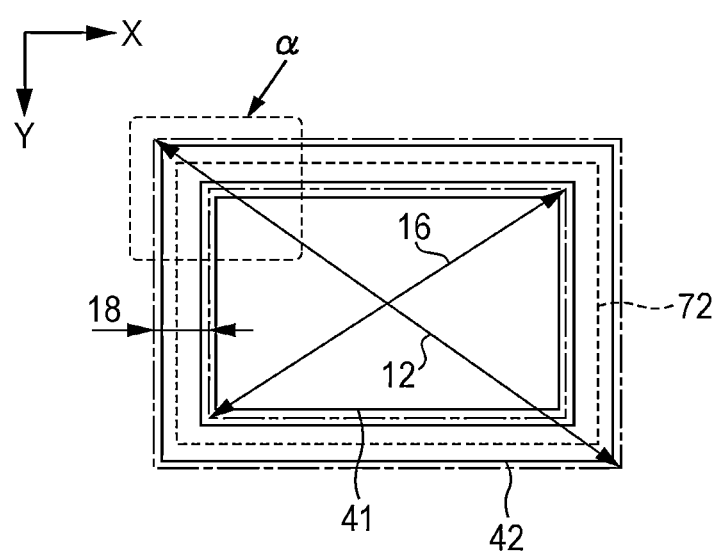
FIG. 10 is a schematic drawing of a first power source conductor and second power source conductor.

A planarization treatment is applied to the surface of the insulating layer LD. In the planarization treatment, a well-known surface treatment technology such as Chemical Mechanical Polishing (CMP) is arbitrarily adopted. As shown in FIG. 3, the first power source conductor 41 and the second power source conductor 42 are formed from the same layer on the surface of the insulating layer LD that is highly planarized in the planarization treatment. FIG. 10 is a plan view of the first power source conductor 41 and the second power source conductor 42, and FIGS. 11-14 are enlarged views of a region a of FIG. 10. As can be understood from FIGS. 10 and 11, the first power source conductor 41 is formed inside the display region 16 of the first region 12, and the second power source conductor 42 is formed inside the peripheral region 18 of the first region 12. The first power source conductor 41 and the second power source conductor 42 are electrically insulated by being spaced apart from one another. The first power source conductor 41 is electrically connected through wiring (not shown in the drawings) in the multi-layered wiring layer to a mounting terminal 36 to which the higher-side power source potential VEL is supplied. In the same manner, the second power source conductor 42 is electrically connected through wiring (not shown in the drawings) in the multi-layered wiring layer to a mounting terminal 36 to which the lower-side power source potential VCT is supplied. The first power source conductor 41 and the second power source conductor 42 are light reflective materials that contain silver or aluminum for example, and are formed to have a film thickness of approximately 100 nm, for example.

The first power source conductor 41 is electrical wiring to which the higher-side power source potential VEL is supplied in the manner described above, and as can be understood from FIGS. 10 and 11, is a substantially rectangular solid pattern that is formed in a planar manner across substantially the entire area of the display region 16. In this instance, a solid pattern refers to a planar pattern (that is, a solid shape) that effectively continues uniformly without gaps so as to coat substantially the entire surface of the display region 16 rather than a linear or zonal pattern, or a pattern that is a combination (for example, a lattice shape) thereof.

Figure 9:
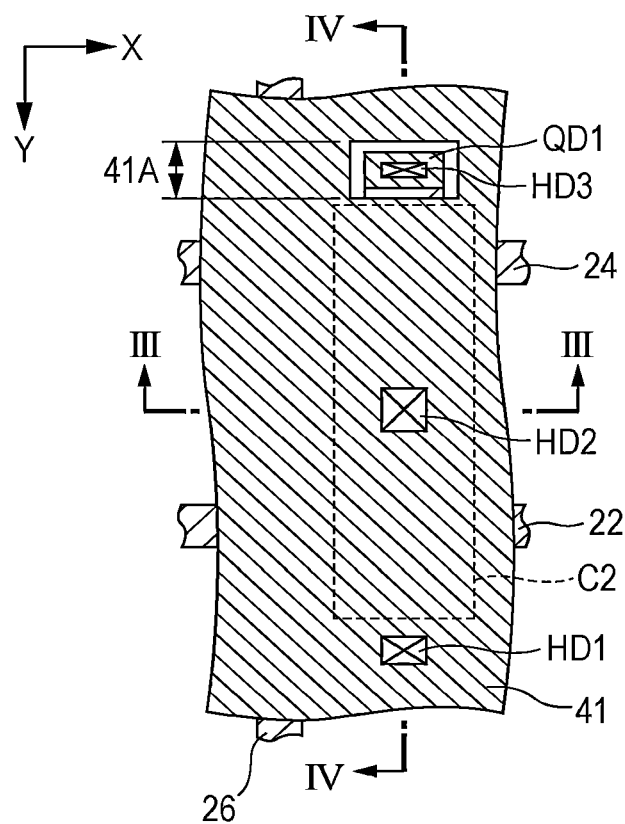
FIG. 9 is an explanatory drawing of each component that is formed on a substrate.
Figure 11:
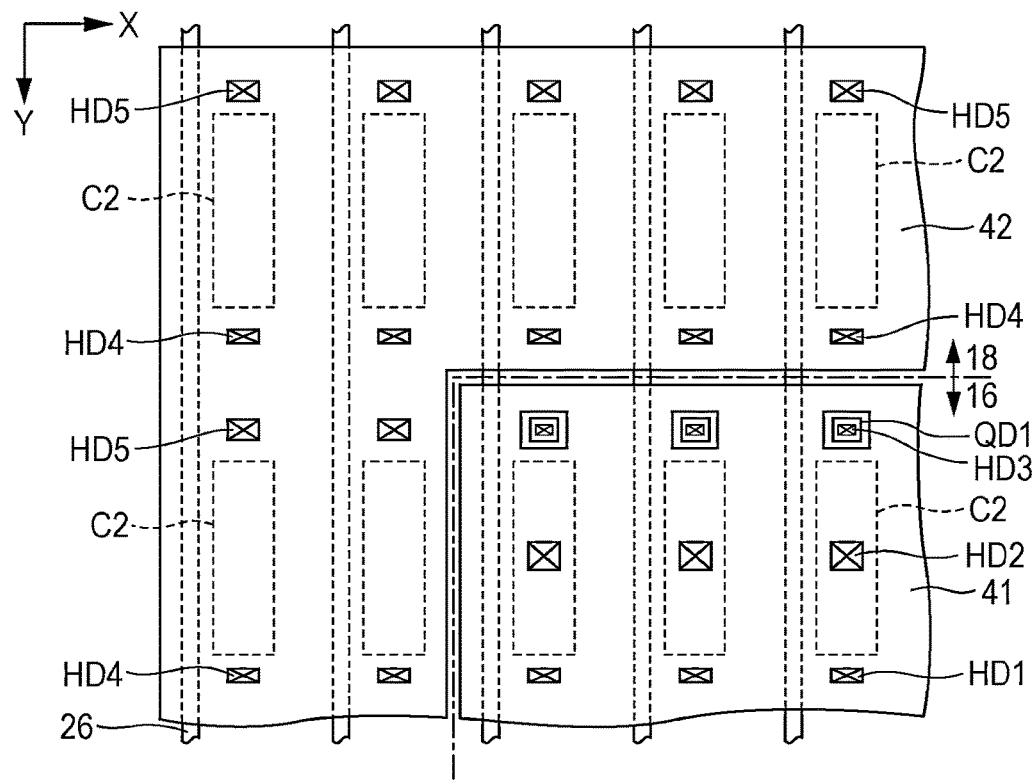
FIG. 11 is an explanatory drawing of each component that is formed on a substrate.

As can be understood from FIGS. 4, 9 and 11, the first power source conductor 41 that is formed in the display region 16 is electrically connected to the relay electrode QC1 through the conduction hole HD1 that is formed in the insulating layer LD for each display pixel PE. That is, as can be understood from FIG. 4, the active region 10A that functions as a source of the drive transistor TDR is connected to the first power source conductor 41 through the relay electrode QA3, the relay electrode QB1 and the relay electrode QC1. Additionally, it is possible to electrically connect (therefore, the relay electrode QC1 is omitted) the first power source conductor 41 to the relay electrode QB2 through the conduction holes that penetrate the insulating layer LC and the insulating layer LD. In addition, as shown in FIGS. 9 and 11, the first power source conductor 41 is connected to the second electrode C2 of the capacitance element C through a conduction hole HD2 of the insulating layer LD. That is, the capacitance element C is provided between the gate GDR and the source (first power source conductor 41) of the drive transistor TDR.

As shown in FIG. 9, an aperture part 41A is formed in the first power source conductor 41 for each display pixel PE. A relay electrode QD1 is formed from the same layer as the first power source conductor 41 and the second power source conductor 42 on the inside of each aperture part 41A. The relay electrode QD1 and the first power source conductor 41 are electrically insulated by being spaced apart from one another. As can be understood from FIGS. 4 and 9, the relay electrode QD1 is electrically connected to the relay electrode QC2 through a conduction hole HD3 that is formed in the insulating layer LD. Additionally, it is possible to electrically connect (therefore, the relay electrode QC2 is omitted) relay electrode QD1 to the relay electrode QB2 through the conduction holes that penetrate the insulating layer LC and the insulating layer LD.

On the other hand, the second power source conductor 42 that is formed in the peripheral region 18, in which the dummy pixels PD are arranged, of the first region 12 is electrical wiring to which the lower-side power source potential VCT is supplied in the manner described above, and as shown in FIG. 10, is formed to be a rectangular frame shape (a closed figure shape) that surrounds the first power source conductor 41 (display region 16) in a plan view. As shown in FIG. 11, a conduction hole HD4 and a conduction hole HD5 are formed in the insulating layer LD for each dummy pixel PD. The second power source conductor 42 is electrically connected to the relay electrode QC1 of the dummy pixel PD through the conduction hole HD4 in addition to being electrically connected to the relay electrode QC2 of the dummy pixel PD through the conduction hole HD5. On the other hand, the aperture part 41A and the relay electrode QD1 of the first power source conductor 41 are not formed in the second power source conductor 42.

As shown in FIGS. 3 and 4, an optical path adjustment layer 60 is formed on the surface of the insulating layer LD in which the first power source conductor 41, the second power source conductor 42 and the relay electrode QD1 are formed. The optical path adjustment layer 60 is an optically transparent film that defines a resonance wavelength (that is, a display color) of a resonance structure of each display pixel PE. The details of the resonance structure and the optical path adjustment layer 60 of each display pixel PE will be described later.

Figure 12:
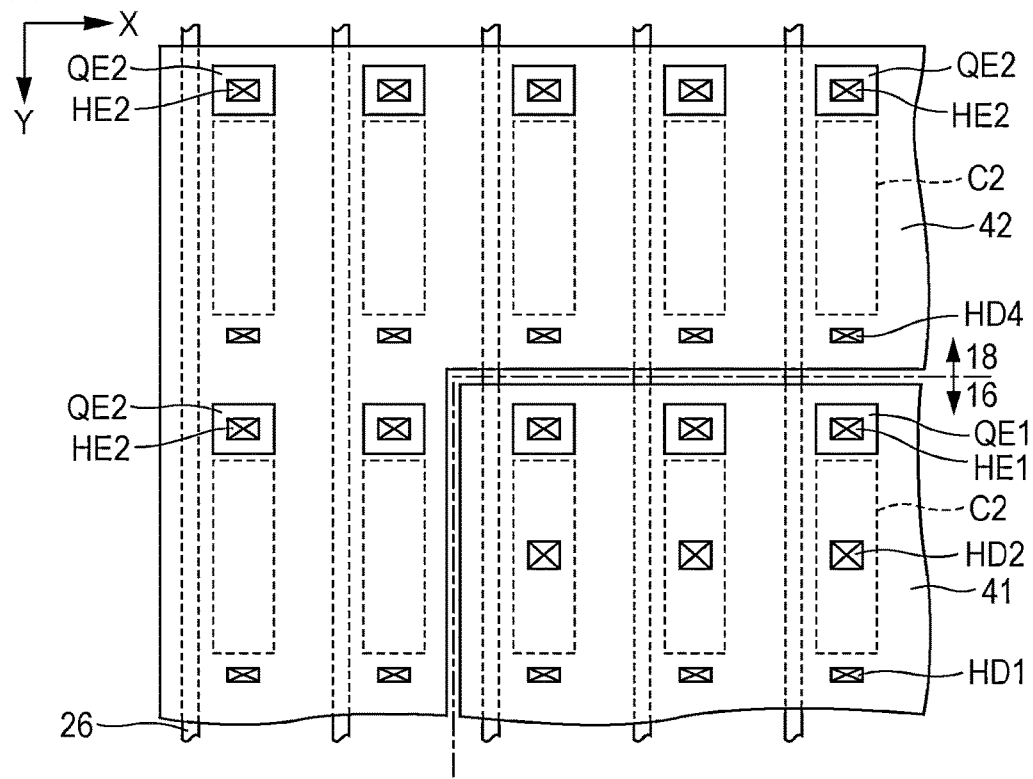
FIG. 12 is an explanatory drawing of each component that is formed on a substrate.

As shown in FIG. 12, a relay electrode QE1 and a relay electrode QE2 are respectively formed from the same layer on the surface of the optical path adjustment layer 60 for each display pixel PE inside the display region 16 and each dummy pixel PD of the peripheral region 18. The relay electrode QE1 and the relay electrode QE2 are formed for example, by an opaque conductive material (for example, titanium nitride).

The relay electrode QE1 inside the display region 16 is electrically connected to the relay electrode QD1 through a conduction hole HE1 that penetrates the optical path adjustment layer 60. As can be understood from FIGS. 4 and 12, the relay electrode QE1 is formed so as to overlap with the aperture part 41A of the first power source conductor 41 in a plan view. That is, the outer peripheral edge of the relay electrode QE1 is positioned on the outside of the inner peripheral edge of the aperture part 41A in plan view. Since the relay electrode QE1 is formed by an opaque conductive material, the intrusion of external light into the multi-layered wiring layer from the aperture part 41A is prevented by the relay electrode QE1. Therefore, there is an advantage in that it is possible to prevent the leakage of the current of each transistor T that is caused by light irradiation. On the other hand, as can be understood from FIG. 12, the relay electrode QE2 in the peripheral region 18 is electrically connected to the second power source conductor 42 through a conduction hole HE2 that penetrates the optical path adjustment layer 60.

Figure 13:
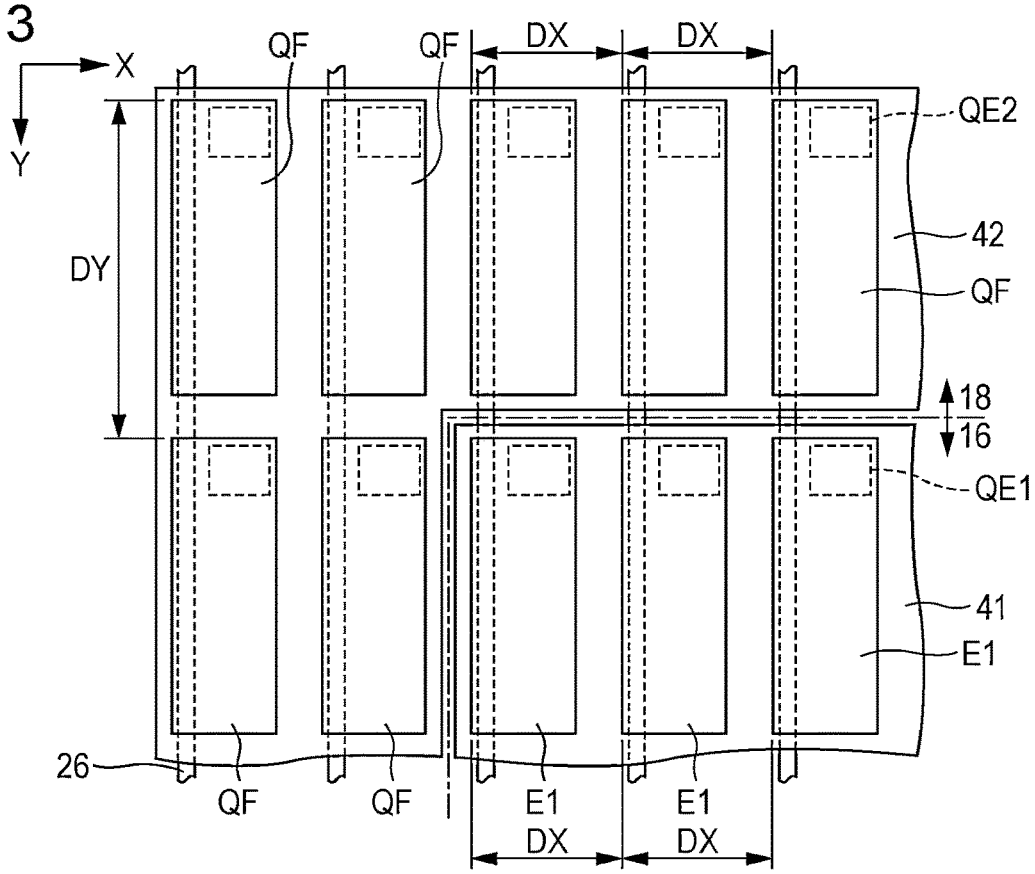
FIG. 13 is an explanatory drawing of each component that is formed on a substrate.

As shown in FIGS. 3, 4 and 13, the first electrode E1 and an electrode for conduction QF are respectively formed from the same layer on the surface of the optical path adjustment layer 60, in which the relay electrode QE1 and the relay electrode QE2 are formed, for each display pixel PE inside the display region 16 and each dummy pixel PD of the peripheral region 18. The first electrode E1 and the electrode for conduction QF are formed for example, by an optically transparent conductive material such as Indium Tin Oxide (ITO). As described earlier with reference to FIG. 2, the first electrode E1 is a substantially rectangular electrode (a pixel electrode) that functions as a positive electrode of the light-emitting element 45, and as shown in FIG. 4, the first electrode E1 is in contact with the relay electrode QE1 on the surface of the optical path adjustment layer 60. That is, the first electrode E1 is electrically connected to the active region 10A (the drain) of the light-emission control transistor TEL through the relay electrode QE1, the relay electrode QD1, the relay electrode QC2, the relay electrode QB2 and the relay electrode QA4.

On the other hand, the electrode for conduction QF inside the peripheral region 18 is a substantially rectangular electrode that is formed in the same rectangular shape and size as the first electrode E1. Each first electrode E1 inside the display region 16 and each electrode for conduction QF inside the peripheral region 18 is arranged at a common pitch (period) across both the X direction and the Y direction. That is, each first electrode E1 and each electrode for conduction QF is arranged at a common pitch DX in the X direction in addition to being arranged at a common pitch DY in the Y direction. A pitch of mutually adjacent first electrodes E1 and electrodes for conduction QF with a boundary of the display region 16 and the peripheral region 18 interposed therebetween is also set to the pitch DX in the X direction and the pitch DY in the Y direction. The pitch DX in the X direction is for example, set to greater than or equal to 1.3 µm and less than or equal to 3.5 µm. As can be understood from FIG. 13, the electrode for conduction QF is in contact with the relay electrode QE2 on the surface of the optical path adjustment layer 60. That is, the electrode for conduction QF is electrically connected to the second power source conductor 42 through the relay electrode QE2. Additionally, a configuration in which an electrode for conduction QF is arranged inside the peripheral region 18 across one line in the X direction and two rows in the Y direction is shown in FIG. 13, but the arrangement number of the electrodes for conduction QF is arbitrary. For example, the arrangement number of the electrodes for conduction QF can be selected as appropriate depending on the interconnection resistance that is required between the second electrode E2 and the second power source conductor 42, the formation range of the light-emission functional layer 46 or the second electrode E2, and the like. As can be understood from FIGS. 3 and 4, the first power source conductor 41 is formed between a wiring layer in which the signal line 26 is formed and a wiring layer in which the first electrode E1 and the electrode for conduction QF are formed.

As shown in FIG. 3, the guard ring 38 in FIG. 1 is configured by a lamination of a plurality of conductive layers QG (QG1-QG6) that are formed from the same layer as the various components that are mentioned above. The conductive layer QG1 is formed from the same layer as each gate of the transistors T, the conductive layer QG2 is formed from the same layer as the signal line 26, and the conductive layer QG3 is formed from the same layer as the second electrode C2 of the capacitance element C. In addition, the conductive layer QG4 is formed from the same layer as the first power source conductor 41 and the second power source conductor 42, the conductive layer QG5 is formed from the same layer as the relay electrode QE2, and the conductive layer QG6 is formed from the same layer as the first electrode E1 and the electrode for conduction QF. Additionally, each conductive layer QG that configures the guard ring 38 can be omitted as appropriate. For example, it is possible to omit the conductive layer QG3 and directly connect the conductive layer QG2 and the conductive layer QG4.

Figure 14:
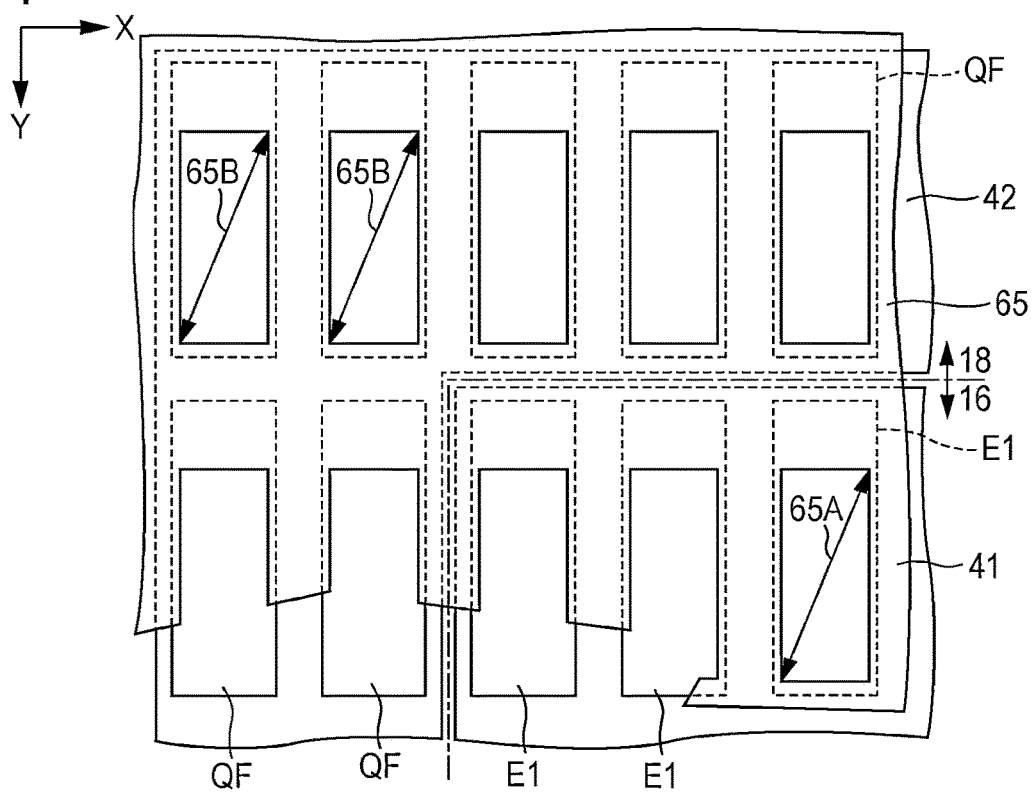
FIG. 14 is an explanatory drawing of each component that is formed on a substrate.

As shown in FIGS. 3, 4 and 14, a pixel definition layer 65 is formed on the surface of the optical path adjustment layer 60, on which the relay electrode QE1, the relay electrode QE2, the first electrode E1 and the electrode for conduction QF are formed, across the entire area of the substrate 10. The pixel definition layer 65 is formed by an insulating inorganic material such as a silicon compound (typically silicon nitride or silicon oxide), for example. As can be understood from FIG. 14, an aperture part (a first aperture part) 65A that corresponds to each first electrode E1 inside the display region 16 and an aperture part (a second aperture part) 65B that corresponds to each electrode for conduction QF inside the peripheral region 18 are formed in the pixel definition layer 65. A region of the pixel definition layer 65 in the vicinity of the inner peripheral edge of the aperture part 65A overlaps with a peripheral edge of the first electrode E1. That is, the inner peripheral edge of the aperture part 65A is positioned on the inner side of the peripheral edge of the first electrode E1 in a plan view. In the same manner, a region of the pixel definition layer 65 in the vicinity of the inner peripheral edge of the aperture part 65B overlaps with a peripheral edge of the electrode for conduction QF. As can be understood from FIGS. 12 and 14, the relay electrode QE1 and the relay electrode QE2 are covered with the pixel definition layer 65. Each aperture part 65A and each aperture part 65B has a common planar shape (rectangular) and size, and is arranged in a matrix at a common pitch across both the X direction and the Y direction. As can be understood from the abovementioned description, the pixel definition layer 65 is formed in a lattice shape in a plan view.

As shown in FIGS. 3 and 4, a light-emission functional layer 46 is formed on the optical path adjustment layer 60 on which the first electrode E1, the electrode for conduction QF and the pixel definition layer 65 are formed. The light-emission functional layer 46 is formed inside the display region 16 of the first region 12 and is continuous across the plurality of display pixels PE. On the other hand, as can be understood from FIG. 3, the light-emission functional layer 46 is not formed in the peripheral region 18 and the second region 14. For example, it is possible to form the light-emission functional layer 46 in a region that is on the display region 12 side of the peripheral region 14. The light-emission functional layer 46 is configured to include a light-emitting layer that is formed by an organic EL material, and radiates white light due to the supply of a current. The white light is light that has a spectrum that extends across a blue wavelength region, a green wavelength region and a red wavelength region, and in which at least two peaks in a visible wavelength region can be observed. Additionally, it is possible to incorporate a transport layer or an implantation layer of electrons or holes, which are supplied to the light-emitting layer, in the light-emission functional layer 46.

The second electrode E2 is formed on the surface of the optical path adjustment layer 60, on which the light-emission functional layer 46 is formed, across the entire area of the first region 12 (the display region 16 and the peripheral region 18). As described earlier with reference to FIG. 2, the second electrode E2 functions as a negative electrode of the light-emitting element 45. As shown in FIG. 4, a region (a light-emitting region) of the light-emission functional layer 46 that is interposed between the first electrode E1 and the second electrode E2 emits light on the inner side of each aperture part 65A of the pixel definition layer 65. That is, a portion in which the first electrode E1, the light-emission functional layer 46 and the second electrode E2 are laminated on the inside of the aperture part 65A functions as the light-emitting element 45. As can be understood from the abovementioned description, the pixel definition layer 65 defines the planar shape and size (a region that emits light in a practical sense) of the light-emitting element 45 of each display pixel PE. The light-emitting device 100 of the first embodiment is a microdisplay in which the light-emitting elements 45 are arranged with extremely high precision. For example, the area (the area of a single aperture part 65A) of a single light-emitting element 45 is set to less than or equal to 40 $\mu m^2$, and an interval between each mutually adjacent light-emitting element 45 in the X direction is set to less than or equal to 1.5 $\mu m$.

A portion of the second electrode E2, which extends across the entire area of the first region 12, that is positioned in the peripheral region 18 is in contact with the electrode for conduction QF on the inner side of the aperture part 65B of the pixel definition layer 65 in FIG. 14. The light-emission functional layer 46 is not formed in a region of the peripheral region 14 that is electrically connected to the electrode for conduction QF and the second electrode E2 and a region that is on the outer side thereof. As can be understood from the abovementioned description, the second electrode E2 that extends across both the display region 16 and the peripheral region 18 is electrically connected to the second power source conductor 42 through each electrode for conduction QF inside the peripheral region 18 and each relay electrode QE2. That is, the lower-side power source potential VCT is supplied from the second power source conductor 42 to the second electrode E2 through the relay electrode QE2 and the electrode for conduction QF.

The second electrode E2 functions as a semi-transmissive reflective layer with a property (a semi-transmissive reflective property) that transmits a portion of light that reaches the surface thereof and reflects residual light. For example, the second electrode E2 with a semi-transmissive reflective property is formed by forming a light reflective conductive material such as an alloy that contains silver or aluminum to a sufficiently thin film thickness. Radiated light from the light-emission functional layer 46 reciprocates between the first power source conductor 41 and the second electrode E2, and a component thereof of with a specific resonance wavelength is selectively amplified, passes through the second electrode E2 and is output to the observation side (a side that is opposite the substrate 10). That is, a resonance structure that causes output light from the light-emission functional layer 46 to resonate between the first power source conductor 41 that functions as a reflective layer and the second electrode E2 that functions as a semi-transmissive reflective layer. The optical path adjustment layer 60 is a component for individually setting a resonance wavelength (display color) of the resonance structure for each display color of the display pixel PE. More specifically, by adjusting an optical path length (optical distance) between the first power source conductor 41 and the second electrode E2 that configure the resonance structure as appropriate depending on the film thickness of the optical path adjustment layer 60, the resonance wavelength of the output light of each display pixel PE is set for each display color.

Figure 15:
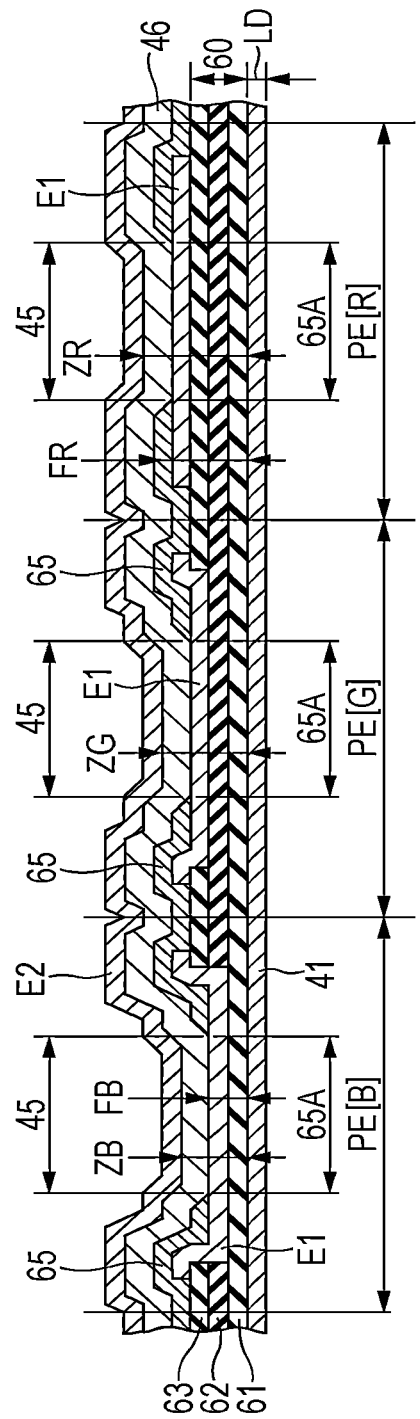
FIG. 15 is a cross-sectional view of each display pixel focusing on an optical path adjustment layer.

FIG. 15 is a cross-sectional view that shows a configuration of three individual display pixels PE with different display colors (red, green and blue) focusing on a specific configuration of the optical path adjustment layer 60. FIG. 15 shows a display pixel PE that corresponds to red (R), a display pixel PE that corresponds to green (G) and a display pixel PE that corresponds to blue (B) for descriptive purposes. As can be understood from FIG. 15, the optical path adjustment layer 60 is configured by a lamination of a plurality of layers (a first adjustment layer 61, a second adjustment layer 62 and a third adjustment layer 63) that is formed by an optically transparent insulating material such as a silicon compound (typically silicon nitride or silicon oxide). The first adjustment layer 61 is for example, silicon nitride that is formed to have a film thickness of greater than or equal to 40 nm and less than or equal to 100 nm, the second adjustment layer 62 is for example, silicon oxide that is formed to have a film thickness of greater than or equal to 40 nm and less than or equal to 50 nm, and the third adjustment layer 63 is for example, silicon oxide that is formed to have a film thickness of greater than or equal to 40 nm and less than or equal to 70 nm.

The second adjustment layer 62 and the third adjustment layer 63 are selectively removed to correspond to the display color of each display pixel PE. More specifically, in the blue display pixels PE, by removing the second adjustment layer 62 and the third adjustment layer 63, the optical path adjustment layer 60 is configured by the first adjustment layer 61 only, and in the green display pixels PE, by removing the third adjustment layer 63, the optical path adjustment layer 60 is configured by the first adjustment layer 61 and the second adjustment layer 62. On the other hand, in the red display pixels PE, the optical path adjustment layer 60 is configured by a lamination of the first adjustment layer 61, the second adjustment layer 62 and the third adjustment layer 63. In a case in which for example, the first adjustment layer 61 is formed with a film thickness of 50 nm, the second adjustment layer 62 is formed with a film thickness of 65 nm and the third adjustment layer 63 is formed with a film thickness of 55 nm, an optical path adjustment layer 60 of 170 nm (the first adjustment layer 61+the second adjustment layer 62+the third adjustment layer 63) is configured in the red display pixels PE, an optical path adjustment layer 60 of 115 nm (the first adjustment layer 61+the second adjustment layer 62) is configured in the green display pixels PE, and an optical path adjustment layer 60 of 50 nm (the first adjustment layer 61) is configured in the blue display pixels PE. In the abovementioned examples, a film thickness difference of the optical path adjustment layer 60 between the red display pixels PE and the blue display pixels PE is 120 nm. Additionally, the abovementioned description focused on the display region 16, but optical path adjustment layers 60 with the same configurations as those inside the display region 16 are also formed in each dummy pixel PD inside the peripheral region 18.

By adjusting the film thickness of the optical path adjustment layer 60 in the abovementioned manner for each display color of the display pixels PE, an interval (hereinafter, referred to as a "resonance length") Z between the first power source conductor 41 that functions as a reflective layer of the resonance structure and the second electrode E2 that functions as a semi-transmissive reflective layer thereof, is set individually for each display color. More specifically, a resonance length ZB of the blue display pixels PE is less than a resonance length ZG of the green display pixels PE, and the resonance length ZG of the green display pixels PE is less than a resonance length ZR of the red display pixels PE (ZB<ZG<ZR). Therefore, blue light is output from the light-emitting element 45 of the blue display pixels PE, green light is output from the light-emitting element 45 of the green display pixels PE, and red light is output from the light-emitting element 45 of the red display pixels PE.

A difference in levels (unevenness) that reflects the shape of each component that is respectively formed in the layers below appears in the surface of the light-emission functional layer 46 and the surface of the second electrode E2. Assuming that the surface of the insulating layer LD and the surface of the first power source conductor 41 are flat surfaces in which there is not a difference in levels, a maximum difference in levels that appears in the surfaces of the light-emission functional layer 46 and the second electrode E2 corresponds to a difference (a difference in height) between a distance FB and a distance FR in FIG. 15. The distance FB is the sum of the film thickness of the first adjustment layer 61 and the first electrode E1. On the other hand, the distance FR is the sum of the film thickness of the optical path adjustment layer 60 (the first adjustment layer 61, the second adjustment layer 62 and the third adjustment layer 63), the pixel definition layer 65 and the first electrode E1. Therefore, the greater the film thickness of the pixel definition layer 65 is, the greater the difference in levels that appears in the surfaces of the light-emission functional layer 46 and the second electrode E2. The difference in levels in each layer can lead to defective film formation such as the breakage of conductive layers and short-circuiting, for example. In consideration of the abovementioned information, the pixel definition layer 65 of the present embodiment is formed to have a film thickness in which flaws such as defective film formation that is caused by a difference in levels of the surfaces of the light-emission functional layer 46 and the second electrode E2, are controlled.

As described earlier, the resonance length of the resonance structure corresponds to each display color of the display pixels PE. In the first embodiment, the film thickness of the pixel definition layer 65 is selected to be less than a difference in resonance length between each differing display color. More specifically, the pixel definition layer 65 of the present embodiment is formed to have a film thickness that is less than the minimum value (a difference Δ) of a difference ΔBG (ΔBG=ZG−ZB) between a blue resonance length ZB and a green resonance length ZG, a difference ΔGR (ΔGR=ZR−ZG) between a green resonance length ZG and a red resonance length ZR and a difference ΔRB (ΔRB=ZR−ZB) between a red resonance length ZR and a blue resonance length ZB. As described earlier, in the first embodiment, the resonance length of the resonance structure differs for each display color depending on the film thickness of the optical path adjustment layer 60. Therefore, it can also be said that the film thickness of the pixel definition layer 65 is less than a film thickness difference of the optical path adjustment layer 60 between each differing display color. As shown before, in a case in which the first adjustment layer 61 is formed with a film thickness of 50 nm, the second adjustment layer 62 is formed with a film thickness of 65 nm and the third adjustment layer 63 is formed with a film thickness of 55 nm, a difference ΔBG is the 65 nm of the film thickness of the second adjustment layer 62, a difference ΔGR is the 55 nm of the film thickness of the third adjustment layer 63 and a difference ΔRB is the 120 nm of the film thickness of the second adjustment layer 62 and the third adjustment layer 63. In the abovementioned configuration, the difference ΔGR (the film thickness of the third adjustment layer 63) between the green resonance length ZG and the red resonance length ZR is 55 nm, but corresponds to a minimum difference Δ of the resonance length between the display colors. Therefore, the pixel definition layer 65 is formed to have a film thickness that is less than 55 nm. For example, the pixel definition layer 65 is formed to have a film thickness of 50 nm, and more preferably formed to have a film thickness of approximately 20 to 30 nm.

Figure 16:
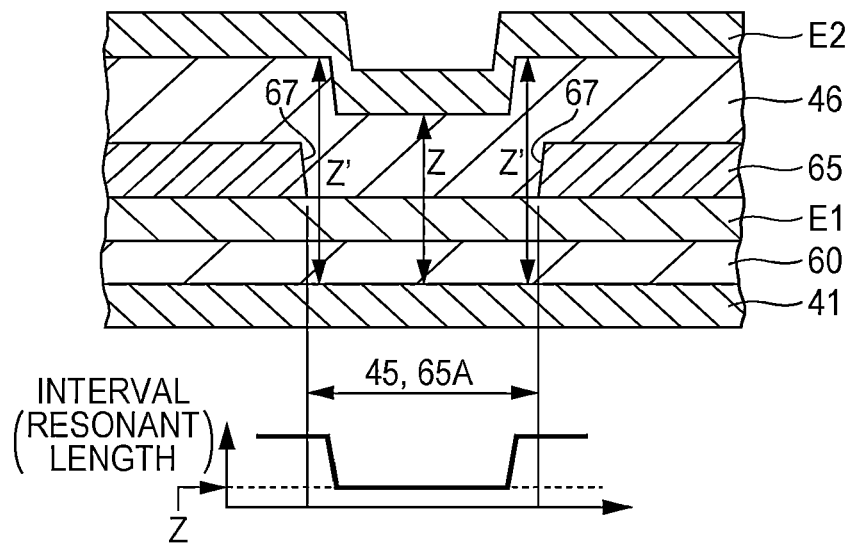
FIG. 16 is a cross-sectional view of each display pixel focusing on an inner peripheral surface of an aperture part of a pixel definition layer.

FIG. 16 is a cross-sectional view in which a single arbitrary display pixel PE that is shown in FIG. 15 is enlarged. As can be understood from FIG. 16, in the vicinity of the an inner peripheral surface 67 of the aperture part 65A of the pixel definition layer 65, there are cases in which an interval between the first power source conductor 41 and the second electrode E2 differs from the target resonance lengths Z (ZR, ZG and ZB) of the resonance structure of the display pixels PE due to the influence of the film thickness of the pixel definition layer 65. For example, as shown in FIG. 16, since a difference in levels that reflects the film thickness of the pixel definition layer 65 is formed on the surfaces of the light-emission functional layer 46 and the second electrode E2, an interval Z' between the first power source conductor 41 and the second electrode E2 in the vicinity of the inner peripheral surface 67 of the aperture part 65A of the pixel definition layer 65 differs from the target resonance lengths Z (ZR, ZG and ZB) that correspond to the display colors of the display pixels PE. Further, in a region in which the interval Z' between the first power source conductor 41 and the second electrode E2 differs from the target resonance lengths Z, monochromatic light, which has a wavelength that differs from the wavelengths (that is, the original wavelength of the display colors) that correspond to a target resonance length Z of the output light from the light-emission functional layer 46, is enhanced by the resonance structure and output from the second electrode E2 to an observation side. Therefore, display colors in the vicinity (the vicinity of the inner peripheral surface 67 of the aperture part 65A) of the outer edge of the light-emitting element 45 in a plan view can differ from the original display colors of the light-emitting element 45. For example, it is assumed that there is a possibility that a green color will be displayed at the peripheral edge of the blue display pixels PE, and a possibility that a yellow or a red color will be displayed at the peripheral edge of the green display pixels PE.

As described above, the greater the film thickness of the pixel definition layer 65 is, the larger a difference in the levels of the second electrode E2 (the semi-transmissive reflective layer). Therefore, the thicker the film thickness of the pixel definition layer 65 is, the larger the difference between the target resonance lengths Z and the interval Z' in the vicinity of the inner peripheral surface 67 is, and the difference between the original display colors of the light-emitting element 45 and the display colors in the vicinity of the peripheral edge of the light-emitting element 45 (a region of the interval Z') becomes apparent. In the present embodiment, since the film thickness of the pixel definition layer 65 is less than the difference Δ, in comparison with a configuration in which the film thickness of the pixel definition layer 65 is greater than the difference Δ (hereinafter, referred to as a "comparative example"), the difference between the target resonance lengths Z and the interval Z' in the vicinity of the inner peripheral surface 67 is small. Therefore, according to the present embodiment, in comparison with the comparative example, there is an advantage in that it is difficult for an observer of a display pixel to perceive disparities between the original display colors of the light-emitting element 45 and the display colors in the vicinity of the peripheral edge of the light-emitting element 45. More specifically, since the film thickness of the pixel definition layer 65 is less than the difference Δ (the minimum value of the difference ΔGR, the difference ΔBG and the difference ΔRB), for example, it is possible to prevent a situation in which the interval Z' in the blue display pixels PE reaches the resonance length ZG of the green display pixels PE (that is, the display color reaching a green color at the peripheral edge of the blue display pixels PE) or a situation in which the interval Z' in the green display pixels PE reaches the resonance length ZR of the red display pixels PE (that is, the display color changing to a red color at the peripheral edge of the green display pixels PE). Therefore, according to the first embodiment, there is an advantage in that it is possible to display a high-definition image in which the accidental error of the display colors of each display pixel PE is reduced.

Figure 17:
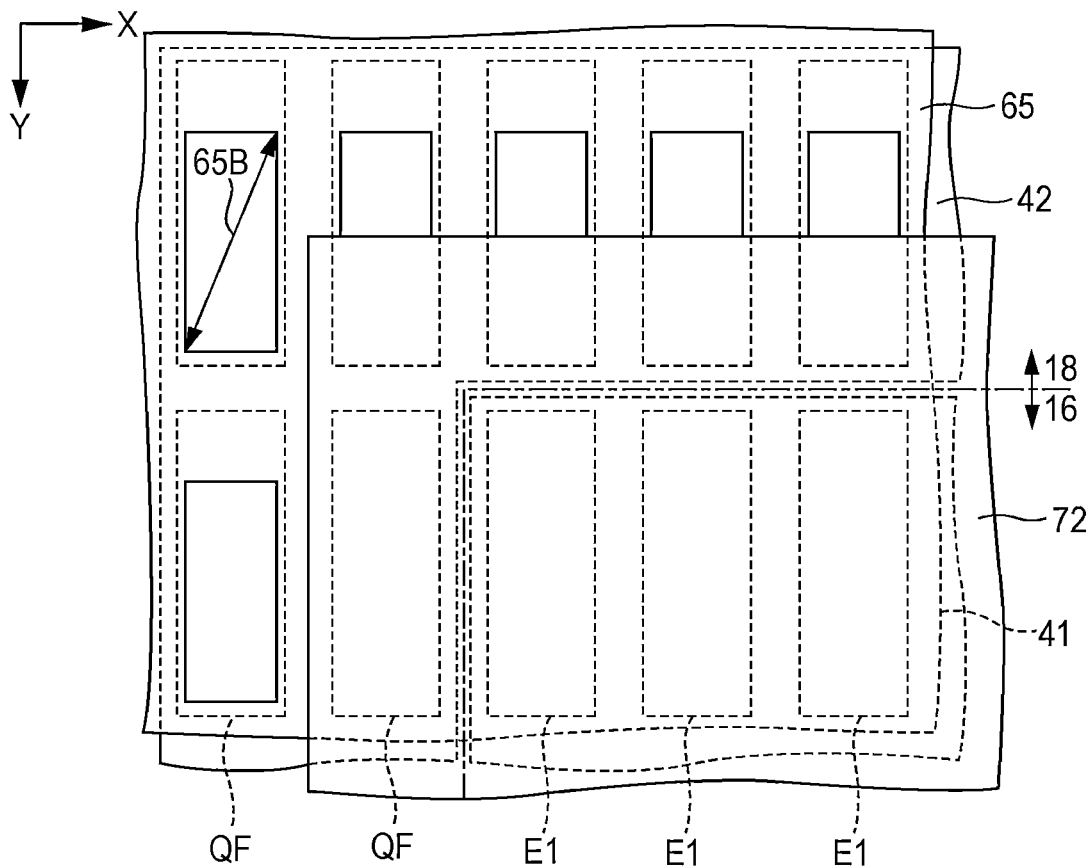
FIG. 17 is an explanatory view of a second sealing layer of a sealing body.

As shown in FIG. 3, a sealing body 70 is formed on the surface of the second electrode E2 across the entire area of the substrate 10. Additionally, the sealing body 70 is omitted from FIG. 4 for descriptive purposes. The sealing body 70 is an optically transparent film that prevents the intrusion of external air and moisture by sealing each component that is formed on the substrate 10, and is configured by a lamination of a first sealing layer 71, a second sealing layer 72 and a third sealing layer 73. The second sealing layer 72 is formed on the surface of the first sealing layer 71, and the third sealing layer 73 is formed on the surfaces of the first sealing layer 71 and the second sealing layer 72. As can be understood from FIG. 3, the first sealing layer 71 and the third sealing layer 73 are formed across the entire area of the substrate 10 that includes the first region 12 and the second region 14. On the other hand, the second sealing layer 72 is formed inside the first region 12 of the substrate 10 and is not formed in the second region 14. More specifically, as shown in FIG. 17, the second sealing layer 72 is formed across the display region 16 and a region of a portion of the inner peripheral edge side of the peripheral region 18. As can be understood from the abovementioned description, the sealing body 70 in FIG. 3 is configured by a lamination of a total of three layers of the first sealing layer 71, the second sealing layer 72 and the third sealing layer 73 inside the display region 16, and is configured by a lamination of a total of two layers of the first sealing layer 71 and the second sealing layer 72 inside the second region 14. Each mounting terminal 36 in FIG. 1 is exposed to the outside through an aperture part that is formed in a region that is connected to a flexible wiring substrate of the sealing body 70. The mounting terminals 36 are for example, configured by a lamination of a conductive layer that is formed from the same layer as the first power source conductor 41 and the second power source conductor 42, a conductive layer that is formed from the same layer as the relay electrode QE2, and a conductive layer that is formed from the same layer as the first electrode E1 and the electrode for conduction QF.

The first sealing layer 71 of the sealing body 70 is formed on the surface of the second electrode E2 and is in direct contact with the surface of the second electrode E2. The first sealing layer 71 is for example, an insulating inorganic material such as a silicon compound (typically silicon nitride or silicon oxide) and is formed to for example, a film thickness of approximately 200 nm to 400 nm. It is preferable that the first sealing layer 71 be formed to have a film thickness that is greater than or equal to the film thickness difference (for example, 120 nm) of the optical path adjustment layer 60. It is preferable that a high-density plasma film formation technique such as a plasma Chemical Vapor Deposition (CVD) method or an Electron Cyclotron Resonance (ECR) plasma sputtering method, or an ion plating method be used in the formation of the first sealing layer 71. It is possible to form the silicon oxynitride first sealing layer 71 through vapor deposition of silicon oxide in a nitrogen atmosphere. In addition, an inorganic compound that is typified by a metal oxide such as titanium nitride can be used as the material of the first sealing layer 71.

The second sealing layer 72 of the sealing body 70 functions as a planarizing film that plugs up the unevenness of the surface of the second electrode E2 and the first sealing layer 71. That is, unevenness that reflects the shape of each component of the lower side (the substrate 10 side) is formed on the surface of the second electrode E2 and the first sealing layer 71, but the surface of the second sealing layer 72 is a substantially flat surface in which unevenness is sufficiently reduced. It could be said that the upper surface of the second sealing layer 72 is flat in comparison with the lower surface (that is, a surface that is in contact with the first sealing layer 71) thereof. In order for the planarizing function that is mentioned above to be realized, the second sealing layer 72 is formed to have a film thickness (for example, 1 μm to 5 μm, and in particular, 3 μm is preferable) that is sufficiently thin in comparison with the first sealing layer 71 and the third sealing layer 73. For example, the second sealing layer 72 is formed by a process in which a solution of an optically transparent organic material such as an epoxy resin is coated onto the surface of the first sealing layer 71 using a publically-known coating technique (for example, a printing method or a sputtering method) and dried. Additionally, the material of the second sealing layer 72 is not limited. For example, it is possible to form a second sealing layer 72 of a film thickness that is sufficient for planarization by forming a coating of an inorganic material such as silicon oxide using a coating technique and drying the coating. The second sealing layer 72 is continuous across a wide region in comparison with the region in which the light-emission functional layer 46 is formed, and is formed to cover at least the light-emission functional layer 46. In addition, it is possible to use a configuration in which the second sealing layer 72 covers the second electrode E2.

The third sealing layer 73 is for example, an inorganic material that has excellent water-resistance and heat resistance and is formed to for example, a film thickness of approximately 300 nm to 700 nm (in particular, 400 nm is preferable). For example, a nitrogen compound (silicon nitride, silicon oxide or silicon oxynitride) is preferable as the material of the third sealing layer 73. A publically-known film formation technique that was shown in the formation of the first sealing layer 71 can be arbitrarily adopted in the formation of the third sealing layer 73.

A sealing layer substrate (not shown in the drawings) is joined to the surface of the substrate 10 on which each of the abovementioned components are formed with an adhesive, for example. The sealing layer substrate is an optically transparent plate-shaped member (for example, a glass substrate) for securing each component on the substrate 10. Additionally, it is possible to form a color filter on the surface of the sealing layer substrate or the surface of the sealing body 70 (the third sealing layer 73) for each display pixel PE.

In addition, the film thickness of the first sealing layer 71 of the sealing body 70 that is in direct contact with the second electrode E2 is greater than the difference Δ (the difference in levels between each constitutive layer of the optical path adjustment layer 60) of the resonance lengths Z. According to a configuration in which the first sealing layer 71 is formed with a sufficient film thickness with respect to the difference in level of the surface of the optical path adjustment layer 60 in the abovementioned manner, the surface of the first sealing layer 71 becomes a sufficiently flat surface (that is, a flat surface in which the difference in level of the optical path adjustment layer 60 is not reflected). That is, it is possible to effectively use the first sealing layer 71 as a planarization film that plugs up the difference in level of the optical path adjustment layer 60. More preferably, the first sealing layer 71 is formed with a film thickness that is greater than or equal to twice the difference Δ of the resonance lengths Z.

In the first embodiment, the electrode for conduction QF that is formed from the same layer as the first electrode E1 inside the display region 16, the second power source conductor 42 that is formed from the same layer as the first power source conductor 41 within the display region 16 are formed in the peripheral region 18, and the second electrode E2 that extends across both the display region 16 and the peripheral region 18 is electrically connected to the second power source conductor 42 through the electrode for conduction QF inside the peripheral region 18. That is, the second power source conductor 42 and the electrode for conduction QF also overlap with one another in the peripheral region 18 in the same manner as a layer structure in which the first power source conductor 41 and the first electrode E1 overlap with one another inside the display region 16. Therefore, in comparison with the configuration of JP-A-2010-56017 in which a positive electrode of the light-emitting elements is not formed in dummy pixels within a flanking region, it is possible to control the difference in the levels of the display region 16 and the peripheral region 18. Further, by controlling the difference in the levels of the display region 16 and the peripheral region 18, there is advantage in that it is possible to form the sealing body 70 easily in comparison with a configuration in which the difference in the levels of the display region 16 and the peripheral region 18 is large. In particular, in the first embodiment, the planar shape and size, and the pitch DX in the X direction and pitch DY in the Y direction are common in the first electrode E1 inside the display region 16 and the electrode for conduction QF inside the peripheral region 18. Therefore, the effect of controlling the difference in the levels of the display region 16 and the peripheral region 18 is particularly significant.

In addition, the aperture part 65B is formed in the pixel definition layer 65, which extends across both the display region 16 and the peripheral region 18, to correspond to the electrode for conduction QF inside the peripheral region 18 in addition to the aperture part 65A that corresponds to the first electrode E1 inside the display region 16. That is, the same structure as that of the display region 16 is also present in the peripheral region 18 in the pixel definition layer 65. Therefore, in comparison with a configuration in which the pixel definition layer 65 is not formed in the peripheral region 18 or a configuration in which the aperture part 65B is not formed in the pixel definition layer 65 in the peripheral region 18, it is possible to control the difference in the levels of the display region 16 and the peripheral region 18. In particular, in the first embodiment, since the planar shape and size, and the arrangement pitches in the X direction and the Y direction are common in the aperture part 65A and the aperture part 65B, the effect of controlling the difference in the levels of the display region 16 and the peripheral region 18 is particularly significant.

Since the first power source conductor 41 is formed from a different layer from that of the scanning line 22, the control line 24 and the signal line 26 in the first embodiment, it is possible to sufficiently secure the area of the first power source conductor 41 (reduce the resistance of the first power source conductor 41) in comparison with a configuration in which the first power source conductor 41 is formed from the same layer as each of the abovementioned wiring. More specifically, as described with reference to FIG. 10, it is possible to form the first power source conductor 41 as a solid pattern that extends across the entire area of the display region 16. Therefore, voltage drop of the power source potential VEL on the inside of the surface of the first power source conductor 41 is controlled, and it is possible to reduce display patches (differences in the display gradation on the inside of the surface of the display region 16) in the display image as a result. Additionally, the abovementioned description focused on the first power source conductor 41, but the same effect is also realized in the second power source conductor 42 that is formed from a different layer from that of the wiring (the scanning line 22, the control line 24 and the signal line 26).

Additionally, in a configuration in which the first power source conductor 41 and the second power source conductor 42 are formed from the same layer, there is a possibility that the first power source conductor 41 and the second power source conductor 42 will mutually cause a short-circuit due to the unevenness of the surface of the insulating layer LD, for example. In the first embodiment, since the first power source conductor 41 and the second power source conductor 42 are formed in addition to carrying out a planarization treatment on the insulating layer LD, there is an advantage in that it is possible to effectively prevent a short-circuit of the first power source conductor 41 and the second power source conductor 42 that is caused by the unevenness of the surface of the insulating layer LD.

Second Embodiment

A second embodiment of the invention will be described. Additionally, in each illustrative embodiment that is shown below, components in which the action and function is the same as those in the first embodiment will be given the reference numerals that are referenced in the description of the first embodiment, and detailed descriptions thereof will be omitted as appropriate.

Figure 18:
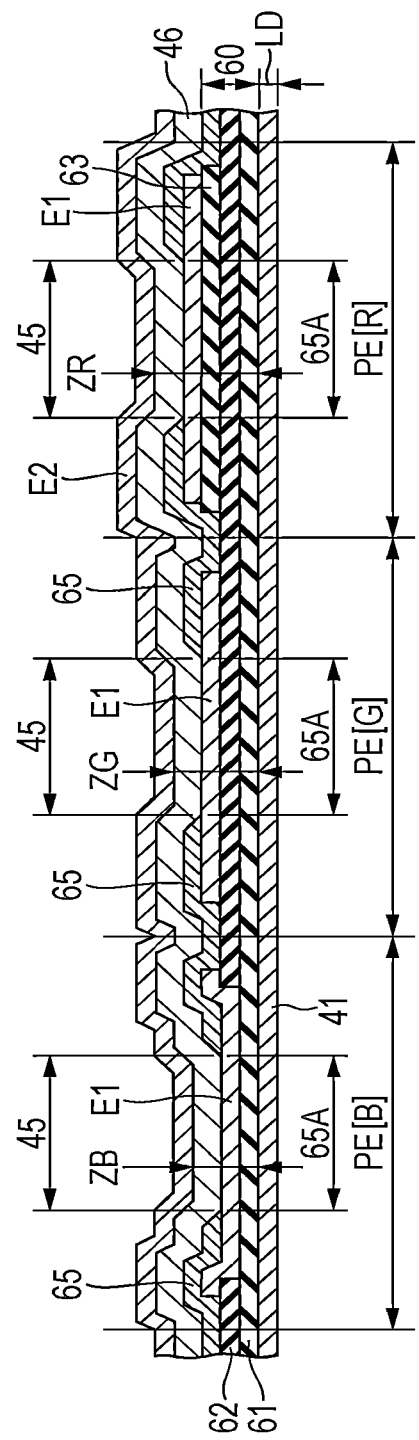
FIG. 18 is a cross-sectional view of each display pixel focusing on an optical path adjustment layer of a second embodiment.

FIG. 18 is a cross-sectional view of each display pixel PE of the second embodiment focusing on a specific configuration of the optical path adjustment layer 60, and corresponds to FIG. 15 that is referenced in the description of the first embodiment. In the first embodiment that is shown in FIG. 15, a configuration in which a total of three layers of the first adjustment layer 61, the second adjustment layer 62 and the third adjustment layer 63 are laminated inside the interval between each mutually adjacent display pixel PE is shown. In the second embodiment, as can be understood from FIG. 18, a total of two layers of the first adjustment layer 61 and the second adjustment layer 62 are laminated inside the interval between each mutually adjacent display pixel PE.

More specifically, the first adjustment layer 61 is formed across the entire area of the substrate 10, and the second adjustment layer 62 is formed on the surface of the first adjustment layer 61 across the entire area of the substrate 10 in addition to a region that corresponds to the blue display pixels PE being removed. Further, the third adjustment layer 63 is formed in island form in a region of the surface of the second adjustment layer 62 that corresponds to the red display pixels PE. Therefore, in the same manner as the first embodiment, the optical path adjustment layer 60 is configured by the first adjustment layer 61 only in the blue display pixels PE, the optical path adjustment layer 60 is configured by a lamination of the first adjustment layer 61 and the second adjustment layer 62 in the green display pixels PE, and the optical path adjustment layer 60 is configured by a lamination of the first adjustment layer 61, the second adjustment layer 62 and the third adjustment layer 63 in the red display pixels PE.

Apart from the optical path adjustment layer 60, the configuration of each component is the same as that of the first embodiment. Therefore, the same effect as that in the first embodiment is also realized in the second embodiment. In addition, in the second embodiment, since the two layers of the first adjustment layer 61 and the second adjustment layer 62 are laminated inside the interval between each mutually adjacent display pixel PE, the difference in levels of the surface of the optical path adjustment layer 60 is reduced in comparison with the first embodiment in which the three layers of the first adjustment layer 61, the second adjustment layer 62 and the third adjustment layer 63 are laminated inside the interval between each display pixel PE. Therefore, there is an advantage in that it is possible to reduce the difference in levels of the surface of each component such as the light-emission functional layer 46 and the second electrode E2.

Third Embodiment

Figure 19:
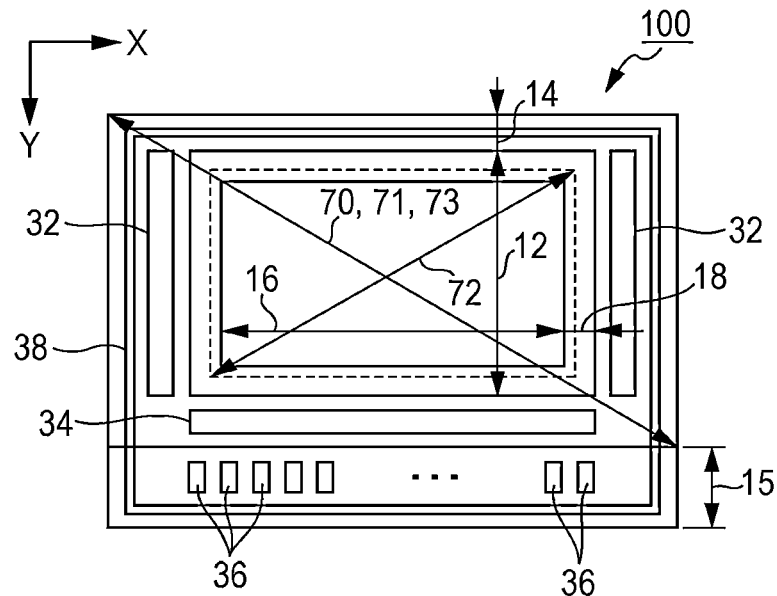
FIG. 19 is a plan view of a light-emitting device of a third embodiment.

FIG. 19 is a plan view that focuses on a sealing body 70 of a light-emitting device 100 of a third embodiment. As shown in FIG. 19, in the light-emitting device 100 of the third embodiment, the sealing body 70 is not formed in a region (hereinafter, referred to as a "terminal region") 15 of the second region 14 of the substrate 10 in which the plurality of mounting terminals 36 are arranged. More specifically, the first sealing layer 71 and the third sealing layer 73 of the sealing body 70 are formed across regions other than the first region 12 that includes the display region 16 and the peripheral region 18 and the terminal region 15 of the second region 14. The configuration with which the second sealing layer 72 of the sealing body 70 is formed inside the display region 16 is the same as that of the first embodiment. According to the abovementioned configuration, there is an advantage in that in addition to the same effect as that of the first embodiment, it is not necessary to form the conduction holes for electrically connecting the mounting terminals 36 to the wiring inside the multi-layered wiring layer in the sealing body 70. Additionally, it is possible to arrange the plurality of mounting terminals 36 along 2 sides of the substrate 10 or 3 sides thereof.

Modification Examples

Various modifications can be made to the abovementioned illustrative embodiments. The aspects of more specific modifications will be shown below. In addition, two or more aspects arbitrarily selected from the examples below can be combined as appropriate within a range that is not mutually contradictory.

(1) In each of the abovementioned illustrative embodiments, a sealing body 70 with a structure in which the first sealing layer 71, the second sealing layer 72 and the third sealing layer 73 were laminated together was shown, but the number of layers (single layered/multilayered) of the sealing body 70 is arbitrary. For example, it is possible to configure the sealing body 70 with a single layer of an inorganic material or an organic material. In addition, in each of the abovementioned aspects, a configuration in which the guard ring 38 overlaps with the entirety of (the first embodiment) or a part of (the third embodiment) the sealing body 70 in a plan view was shown, but the presence or absence of overlap of the sealing body 70 and the guard ring 38 is not an issue.

(2) In each of the abovementioned illustrative embodiments, in the same manner as the aperture part 65A inside the display region 16, the second electrode E2 is electrically connected to the second power source conductor 42 through the aperture part 65B that is formed in the pixel definition layer 65, but the configuration with which the second electrode E2 is electrically connected to the second power source conductor 42 can be changed as appropriate. For example, as disclosed in JP-A-2005-352498, it is possible to electrically connect the second electrode E2 to the second power source conductor 42 through an aperture part that is formed in the pixel definition layer 65 in a linear manner (that is, an aspect that differs from the aperture part 65A of the display region 16) in plan view.

(3) In each of the abovementioned illustrative embodiments, a light-emitting device 100 that uses a semiconductor substrate as the substrate 10 was shown, but the material of the substrate 10 is arbitrary. For example, it is possible to use a plate-shaped member such as glass or quartz as the substrate 10. In addition, in each of the abovementioned aspects, a drive circuit 30 was disposed in the second region 14 of the substrate 10 which was on the outer side of the first region 12, but it is possible to dispose the drive circuit 30 inside the peripheral region 18, for example. For example, the drive circuit 30 can be disposed between the second power source conductor 42 and the substrate 10.

(4) The configuration of the pixels P (pixel circuits) is not limited to the configuration that was shown earlier in FIG. 2. For example, it is possible to adopt a configuration in which the light-emission control transistor TEL of each aspect is omitted or a configuration in which accidental error of the threshold voltage of the drive transistor TDR is compensated for by diode-connecting the drive transistor TDR before the gradation potential is supplied.

(5) The configuration of the light-emitting element 45 is not limited to that shown above. For example, in each of the abovementioned aspects, a configuration in which a plurality of light-emission functional layers 46 that emit white light are formed continuously across the display pixels PE is shown, but it is possible to form a light-emission functional layer 46 that radiates monochromatic light at a wavelength that corresponds to the display color of each display pixel PE individually for each display pixel PE. In addition, in each of the abovementioned aspects, a resonance structure is formed between the first power source conductor 41 (a reflective layer) and the second electrode E2 (a semi-transmissive reflective layer), but for example, it is possible to form a resonance structure between the first electrode E1 (a reflective layer) and the second electrode E2 (a semi-transmissive reflective layer) by forming the first electrode E1 of a reflective conductive material. In a configuration that uses the first electrode E1 as a reflective layer, the optical path adjustment layer 60 is formed between the first electrode E1 and the second electrode E2. It is also possible to form a reflective layer (a reflective layer for each display pixel PE or a reflective layer that is continuous across the plurality of display pixels PE) of a resonance structure separately from the first power source conductor 41 and the first electrode E1.

In each of the abovementioned illustrative embodiments, the resonance wavelength of the display pixels PE was adjusted by the optical path adjustment layer 60, but it is possible to adjust the resonance wavelength of the display pixels PE depending on the film thickness of first electrode E1 or the light-emission functional layer 46. Regardless of a specific configuration for adjusting the resonance wavelength, a configuration in which the first sealing layer 71 is formed to have a film thickness that is greater than the difference in levels that is caused by differences in resonance wavelength is preferable.

In each of the abovementioned illustrative embodiments, a light-emitting element 45 that uses an organic EL material is shown, but the present invention can use a configuration that uses light-emitting elements such as a light-emitting element in which a light-emitting layer is formed using an inorganic EL material or an LED, in the same manner. In addition, in each of the abovementioned aspects, a top emission type light-emitting device 100 that outputs light on a side that is opposite the substrate 10 was shown, but the present invention can be adopted in a bottom emission type light-emitting device that outputs light on a substrate 10 side, in the same manner.

(6) In each of the abovementioned illustrative embodiments, a pixel definition layer 65 with a film thickness that is less than the minimum value (a difference Δ) of a difference in resonance length between each differing display color is formed, but the conditions of the film thickness of the pixel definition layer 65 are not limited to the abovementioned example. For example, it is possible to select the film thickness of the pixel definition layer 65 so that it is less than a difference Δ that is other than the minimum value of a plurality of differences Δ (ΔBG, ΔGR and ΔRB) that correspond to the combinations of the differing display colors. For example, as illustrated in the first embodiment, in a case in which the difference ΔBG between the blue resonance length ZB and the green resonance length ZG is 65 nm, the difference ΔGR between the green resonance length ZG and the red resonance length ZR is 55 nm, and the difference ΔRB between the red resonance length ZR and the blue resonance length ZB is 120 nm, it is possible to form a pixel definition layer 65 with a film thickness that is less than the difference ΔBG (for example, 60 nm). However, according to the abovementioned illustrative embodiment, that forms the pixel definition layer 65 with a film thickness that is less than the minimum value of differences in the resonance lengths of each differing display color, there is an advantage in that the abovementioned effect of it being difficult for an observer to perceive disparities between the original display colors of the light-emitting element 45 and the display colors at the peripheral edge of the light-emitting element 45 is realized in all of the display colors of the display pixels PE.

(7) In each of the abovementioned illustrative embodiments, a configuration in which dummy pixels PD, with a structure (the structure of the wiring, the transistors, the capacitance elements and the like) that is similar to that of the display pixels PE, are arranged inside the peripheral region 18 was shown, but the structure inside the peripheral region 18 is not limited to that which is shown above. For example, it is possible to dispose the drive circuit 30 (the scanning line drive circuit 32 or the signal line drive circuit 34) and circuits and wiring other than the drive circuit 30 in a lower layer of the second power source conductor 42 inside the peripheral region 18.

(8) Each of the abovementioned illustrative embodiments focused on the film thickness of the optical path adjustment layer 60 in order to simplify the description of the resonance structure, but in a practical sense, the refractive index of each layer that is positioned between the reflective layer of the resonance structure (for example, the first power source conductor 41) and the semi-transmissive reflective layer thereof (for example, the second electrode E2), and the resonance wavelength of the resonance structure are set depending on phase shift in the surface of the reflective layer and the semi-transmissive reflective layer.

Electronic Device

Figure 20:
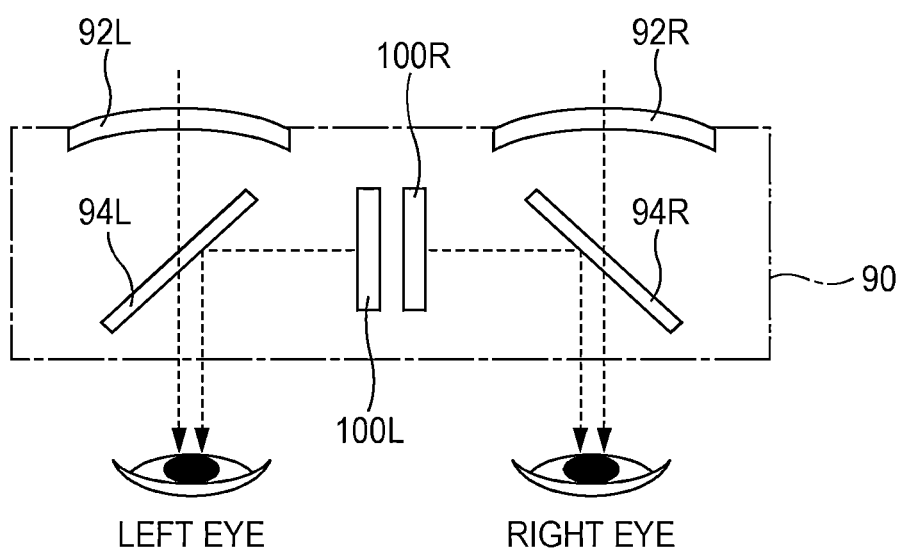
FIG. 20 is a schematic view of a head-mounted display apparatus which is an example of an electronic device.

A light-emitting device 100 with each of the aspects shown above can be used as a display apparatus of various electronic devices. FIG. 20 shows a head-mounted display apparatus 90 (HMD) that uses a light-emitting device 100 with each of the aspects shown above as an example of an electronic device.

The display apparatus 90 is an electronic apparatus that can be mounted on the head of a user, and is equipped with a transmissive part (lens) 92L that overlaps with the left eye of a user, a transmissive part 92R that overlaps with the right eye of a user, a light-emitting device 100L and a half mirror 94L for the left eye, and a light-emitting device 100R and a half mirror 94R for the right eye. The light-emitting device 100L and the light-emitting device 100R are disposed such that output light therefrom proceeds toward directions that are mutually opposite one another. The half mirror 94L for the left eye transmits transmitted light from the transmissive part 92L to the side of the left eye of a user in addition to reflecting output light from the light-emitting device 100L to the side of the left eye of the user. In the same manner, the half mirror 94R for the right eye transmits transmitted light from the transmissive part 92R to the side of the right eye of a user in addition to reflecting output light from the light-emitting device 100R to the side of the right eye of the user. Therefore, the user perceives an image in which an image that can be observed through the transmissive part 92L and the transmissive part 92R, and display image from each light-emitting device 100 are superimposed. In addition, by displaying stereoscopic images (an image for the left eye and an image for the right eye) to which parallaxes have been mutually applied with the light-emitting device 100L and the light-emitting device 100R, it is possible for a user to perceive a stereoscopic effect of a display image.

Additionally, an electronic apparatus that uses a light-emitting device 100 with each of the abovementioned aspects is not limited to the display apparatus 90 in FIG. 20. For example, the light-emitting device 100 of the present invention can also be suitably used in an electronic view finder (EVF) that is used in an imaging device such as a video camera or a still camera. In addition, the light-emitting device of the present invention can be used in the monitors of mobile telephones, handheld terminals (smartphones), televisions and personal computers, and various electronic apparatuses such as car navigation devices.

The entire disclosure of Japanese Patent Application No. 2013-137784, filed Jul. 1, 2013 is expressly incorporated by reference herein.

What is claimed is:

1. A light-emitting device comprising:
    a substrate;
    an electrode having reflectivity and transparency;
    a first pixel electrode that has reflectivity and that is provided between the substrate and the electrode;
    a second pixel electrode that has reflectivity and that is provided between the substrate and the electrode;
    a light-emission functional layer provided between the electrode and the first pixel electrode and between the electrode and the second pixel electrode;
    an insulating layer provided between the light-emission functional layer and the first pixel electrode and between the light-emission functional layer and the second pixel electrode;
    a first optical path adjustment layer being disposed between the first pixel electrode and the electrode; and
    a second optical path adjustment layer being disposed between the second pixel electrode and the electrode, a thickness of the second optical path adjustment layer being thicker than a thickness of the first optical path adjustment layer, wherein
    a first distance between a top surface of the first pixel electrode and a bottom surface of the electrode is different from a second distance between a top surface of the second pixel electrode and the bottom surface of the electrode, and
    a thickness of the insulating layer is less than a difference between the first distance and the second distance.

2. The light-emitting device according to claim 1, further comprising:
    a first sealing layer provided on an opposite side of the electrode from the light-emitting functional layer, wherein
    a thickness of the first sealing layer is greater than the difference between the first distance and the second distance.

3. The light-emitting device according to claim 2, wherein the thickness of the first sealing layer is greater than twice the difference between the first distance the second distance.

4. The light-emitting device according to claim 2, further comprising:
    a second sealing layer provided on an opposite side of the first sealing layer from the electrode, wherein
    a thickness of the second sealing layer is thicker than the thickness of the first sealing layer.

5. An electronic apparatus comprising the light-emitting device according to claim 1.

6. An electronic apparatus comprising the light-emitting device according to claim 2.

7. An electronic apparatus comprising the light-emitting device according to claim 3.

8. An electronic apparatus comprising the light-emitting device according to claim 4.

* * * * *